(12) United States Patent
Tsuchiya et al.

(10) Patent No.: US 11,211,406 B2
(45) Date of Patent: Dec. 28, 2021

(54) SEMICONDUCTOR DEVICE AND METHOD FOR CONTROLLING SEMICONDUCTOR DEVICE

(71) Applicant: RENESAS ELECTRONICS CORPORATION, Tokyo (JP)

(72) Inventors: Ryuta Tsuchiya, Tokyo (JP); Toshiaki Iwamatsu, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 304 days.

(21) Appl. No.: 15/251,238

(22) Filed: Aug. 30, 2016

(65) Prior Publication Data

US 2016/0372486 A1 Dec. 22, 2016

Related U.S. Application Data

(60) Continuation of application No. 15/018,533, filed on Feb. 8, 2016, now abandoned, which is a division of
(Continued)

(30) Foreign Application Priority Data

Nov. 28, 2007 (JP) .............................. JP2007-307760

(51) Int. Cl.
*H01L 27/12* (2006.01)
*H01L 21/84* (2006.01)
(Continued)

(52) U.S. Cl.
CPC .......... *H01L 27/1203* (2013.01); *H01L 21/84* (2013.01); *H01L 27/11* (2013.01);
(Continued)

(58) Field of Classification Search
CPC ............. H01L 21/84; H01L 21/823878; H01L 29/0649; H01L 27/1116; H01L 27/1104;
(Continued)

(56) References Cited

U.S. PATENT DOCUMENTS 5,986,309 A 11/1999 Fujimoto et al.
6,157,063 A 12/2000 Iiboshi
(Continued)

FOREIGN PATENT DOCUMENTS

JP 04-352467 A 12/1992
JP 07-106579 A 4/1995
(Continued)

OTHER PUBLICATIONS

Office Action U.S. Appl. No. 15/018,533 dated Jun. 15, 2016.
(Continued)

*Primary Examiner* — Vongsavanh Sengdara
(74) *Attorney, Agent, or Firm* — McDermott Will & Emery LLP

(57) ABSTRACT

To provide a semiconductor device having a thin-film BOX-SOI structure and capable of realizing a high-speed operation of a logic circuit and a stable operation of a memory circuit. A semiconductor device according to the present invention includes a semiconductor support substrate, an insulation layer having a thickness of at mast 10 nm, and a semiconductor layer. In an upper surface of the semiconductor layer, a first field-effect transistor including a first gate electrode and constituting a logic circuit is formed. Further, in the upper surface of the semiconductor layer, a second field-effect transistor including a second gate electrode and constituting a memory circuit is formed. At least three well regions having different conductivity types are formed in the semiconductor support substrate. In the presence of the well regions, a region of the semiconductor
(Continued)

support substrate below the first gate electrode and a region of the semiconductor support substrate below the second gate electrode are electrically separated from each other.

12 Claims, 22 Drawing Sheets

Related U.S. Application Data application No. 12/277,833, filed on Nov. 25, 2008, now Pat. No. 9,287,292.

(51) Int. Cl.
- *H01L 27/11* (2006.01)
- *H03K 17/687* (2006.01)
- *H01L 29/06* (2006.01)
- *H01L 21/8238* (2006.01)
- *H01L 27/105* (2006.01)

(52) U.S. Cl.
CPC ...... *H01L 27/1104* (2013.01); *H01L 27/1116* (2013.01); *H01L 29/0649* (2013.01); *H03K 17/6872* (2013.01); *H01L 21/823878* (2013.01); *H01L 27/105* (2013.01)

(58) Field of Classification Search
CPC ... H01L 27/1203; H01L 27/11; H01L 27/105; H03K 17/6872
See application file for complete search history.

(56) References Cited

U.S. PATENT DOCUMENTS

| | | | |
|---|---|---|---|
| 6,407,427 B1* | 6/2002 | Oh | H01L 29/78615 257/276 |
| 6,455,882 B1 | 9/2002 | Nakura | |
| 6,911,705 B2 | 6/2005 | Nishinohara | |
| 7,023,054 B2 | 4/2006 | Ohsawa | |
| 7,425,746 B2 | 9/2008 | Ohsawa | |
| 7,638,840 B2 | 12/2009 | Ohsawa | |
| 8,409,936 B2 | 4/2013 | Tsuchiya et al. | |
| 2002/0185675 A1* | 12/2002 | Furukawa | H01L 29/78606 257/327 |
| 2002/0190322 A1* | 12/2002 | Mouli | H01L 21/26533 257/347 |
| 2004/0101999 A1* | 5/2004 | Oda | H01L 21/26513 438/197 |
| 2004/0155281 A1 | 8/2004 | Osada et al. | |
| 2004/0262693 A1 | 12/2004 | Ohsawa | |
| 2005/0023567 A1 | 2/2005 | Nishinohara | |
| 2005/0205931 A1* | 9/2005 | Mouli | H01L 21/84 257/347 |
| 2005/0212060 A1 | 9/2005 | Nishinohara | |
| 2005/0253197 A1 | 11/2005 | Tokushige | |
| 2006/0027877 A1* | 2/2006 | Inaba | H01L 27/0928 257/371 |
| 2006/0099753 A1* | 5/2006 | Chen | H01L 21/823878 438/199 |
| 2006/0131660 A1* | 6/2006 | Ohsawa | H01L 27/1203 257/369 |
| 2007/0029620 A1 | 2/2007 | Nowak | |
| 2007/0164360 A1 | 7/2007 | Morooka et al. | |
| 2007/0210418 A1 | 9/2007 | Nakajima | |
| 2008/0061869 A1 | 3/2008 | Takatori | |
| 2008/0093677 A1* | 4/2008 | Kim | H01L 29/7833 257/390 |
| 2008/0297236 A1 | 12/2008 | Ohsawa | |
| 2009/0134468 A1 | 5/2009 | Tsuchiya et al. | |
| 2010/0084709 A1 | 4/2010 | Tsuchiya et al. | |
| 2012/0196411 A1 | 8/2012 | Tsuchiya et al. | |
| 2013/0240991 A1 | 9/2013 | Tsuchiya et al. | |

FOREIGN PATENT DOCUMENTS

| | | |
|---|---|---|
| JP | 09-223802 A | 8/1997 |
| JP | 10-242460 A | 9/1998 |
| JP | 2001-168338 A | 6/2001 |
| JP | 2001-284596 A | 10/2001 |
| JP | 2004-207694 A | 7/2004 |
| JP | 2005-19799 A | 1/2005 |
| JP | 2005-26353 A | 1/2005 |
| JP | 2005-51140 A | 2/2005 |
| JP | 2005-251776 | 9/2005 |
| JP | 2006-049628 A | 2/2006 |
| JP | 2007-180402 A | 7/2007 |
| JP | 2007-242950 A | 9/2007 |
| JP | 5528667 B2 | 6/2014 |
| WO | 2007/004535 A1 | 1/2007 |

OTHER PUBLICATIONS

Notice of Allowance U.S. Appl. No. 12/277,833 dated Nov. 6, 2015.
Notice of Reasons for Rejection Japanese Patent Appication No. 2013-230125 dated Jan. 27, 2015 with full translation.
Non-Final Office Action U.S. Appl. No. 12/277,833 dated Jul. 29, 2015.
Final Office Action U.S. Appl. No. 12/277,833 dated Apr. 16, 2015.
Final Office Action U.S. Appl. No. 12/277,833 dated Dec. 29, 2014.
Japanese Office Action and partial English translation thereof, issued in Japanese Patent Application No. 2013-230125 dated Jul. 15, 2014.
Non-Final Office Action U.S. Appl. No. 12/277,833 dated Jun. 11, 2014.
Japanese Office Action and partial English translation thereof, issued in Japanese Patent Application No. 2007-307760 dated Aug. 28, 2012.
Final Office Action U.S. Appl. No. 12/277,833 dated Oct. 5, 2012.
Non-Final Office Action U.S. Appl. No. 12/277,833 dated Apr. 12, 2012.
Final Office Action U.S. Appl. No. 12/277,833 dated Jan. 4, 2011.
Non-Final Office Action U.S. Appl. No. 12/277,833 dated Aug. 11, 2010.
Tsuchiya et al., "Silicon on Thin BOX: A New Paradigm of the CMOSFET for Low-Power Appication Featuring Wide-Range Black-Bios Control", pp. 631 IEDM Tech (2004).
Office Action Japanese Patent Application No. 2015-092703 dated May 24, 2016 with partial English translation.
Japanese Office Action issued in Application No. 2016-139253 dated Feb. 28, 2017, with English translation.
Japanese Office Action issued in corresponding Japanese Patent Application No. 2017-165517, dated Jun. 5, 2018, with partial English Translation.

* cited by examiner

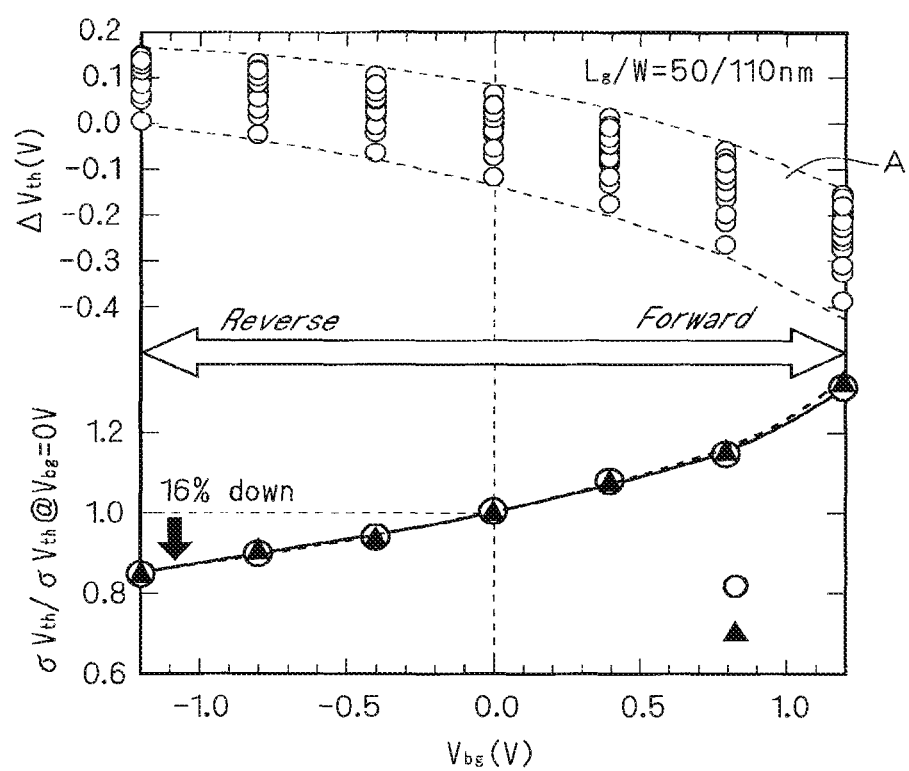
F I G . 1

F I G . 9
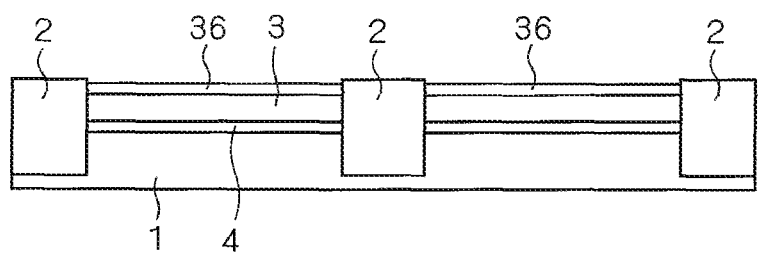
F I G . 1 0
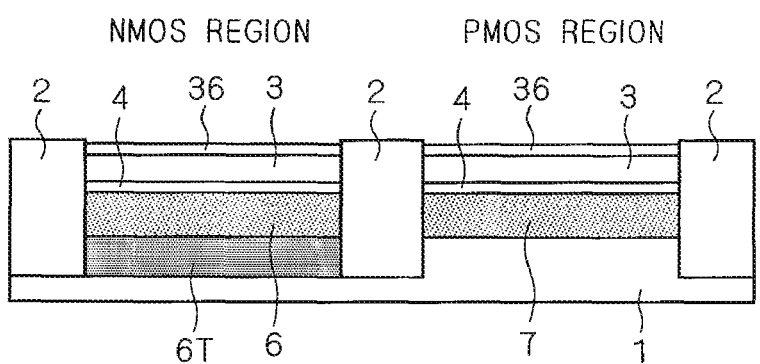

F I G . 2 0
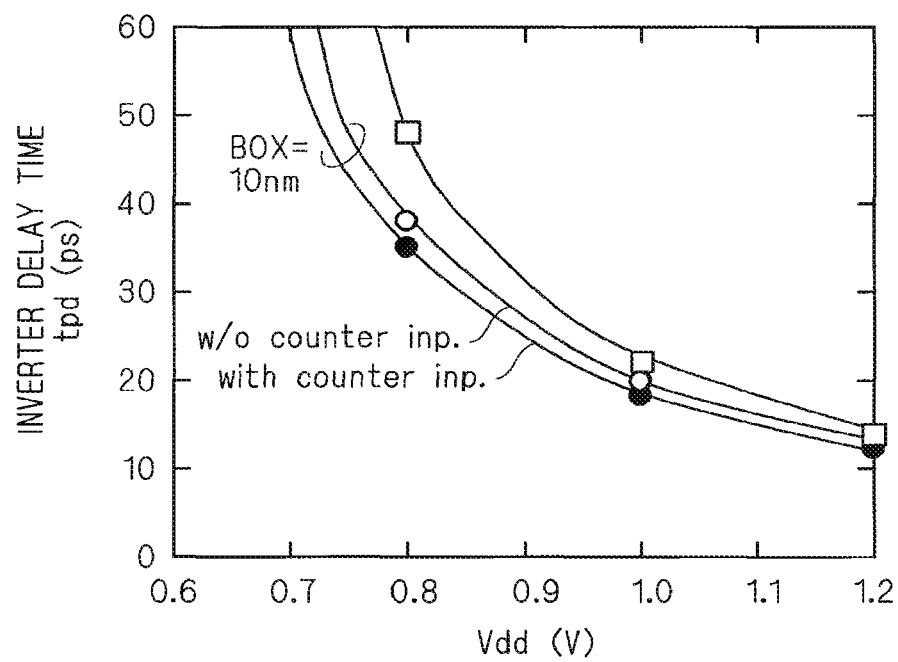
F I G . 2 1
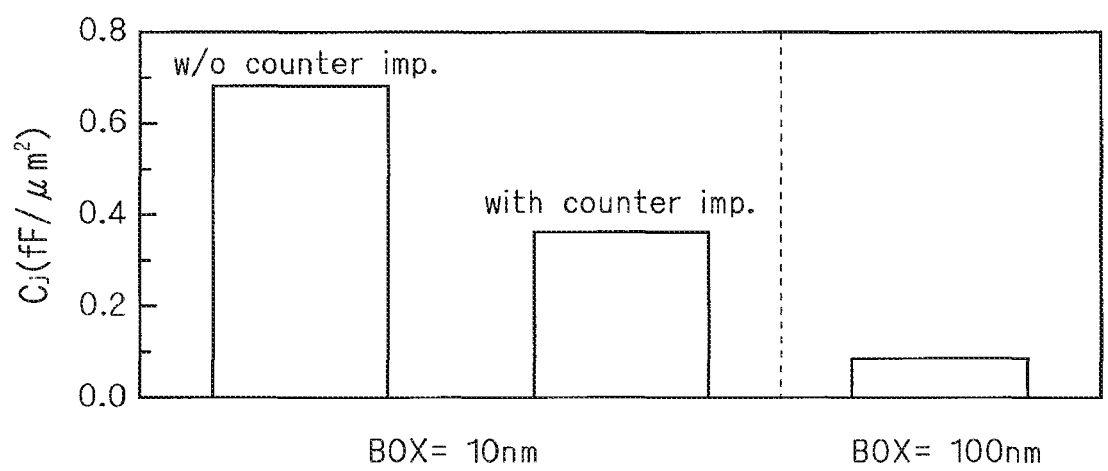

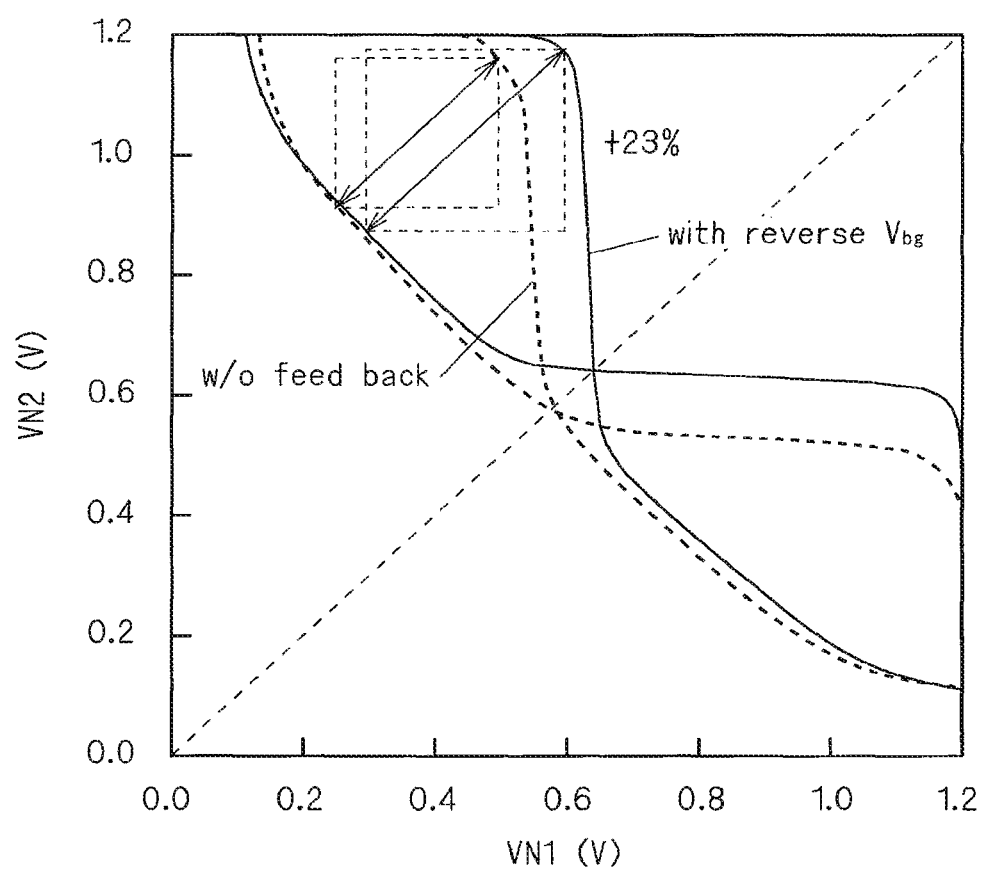
F I G . 2 4

SEMICONDUCTOR DEVICE AND METHOD FOR CONTROLLING SEMICONDUCTOR DEVICE

CROSS-REFERENCE TO RELATED APPLICATIONS

The subject Application is a Continuation Application of U.S. Ser. No. 15/018,533 filed Feb. 8, 2016, which is a Divisional Application of U.S. Ser. No. 12/277,833 filed Nov. 25, 2008 now U.S. Pat. No. 9,287,292, which claims priority to Japanese Patent Application No. 2007-307760 filed Nov. 28, 2007. The subject matter of each is incorporated herein by reference in entirety.

BACKGROUND OF THE INVENTION

Field of the Invention

The present invention relates to a semiconductor device and a method for controlling the semiconductor device, and more particularly to a semiconductor device having the SOI structure and a method for controlling the semiconductor device.

Description of the Background Art

A SOI (Silicon On Insulating) device has a number of superior characteristics such as low power consumption, high-speed operation, and latch-up free. A thin-film BOX-SOI device, in which a BOX (Buried Oxide) layer is reduced in thickness to approximately 10 nm, in particular, has a planar double-gate structure. Therefore, the device is advantageous in that a short channel can be realized while a dopant concentration of the SOI layer is retained at a low level, and variability of a threshold voltage resulting from dopant-induced fluctuation, which has been increasingly evident in and after the 65-nm generation, can be lessened. For example, Japanese Patent Application Laid-Open No. 2005-251776 and R. Tsuchiya et al., "Silicon on Thin BOX: A New Paradigm of The CMOSFET for Low-Power and High-Performance Application Featuring Wide-Range Back-Bias Control", IEDM Tech., 2004, pp 631, and the like, recite the conventional technologies relating to the BOX-SOI device.

It is described below how the threshold voltage variability and an operation stability of SRAM (Static Random Access Memory) relate to each other. When the threshold voltage variability is 20 mV, there is some allowance in an operation margin. When the threshold voltage variability is 40 mV, however, there is hardly the operation margin. In a case where a conventional bulk transistor is used as the transistor in and after the 65-nm generation, it is difficult to control the threshold voltage variability to at most 40 mV, which, therefore, makes it difficult to constantly operate the SRAM in a stable manner.

The thin-film BOX-SOI device, which is configured such that not only the threshold voltage variability can be reduced but also the thin-film BOX layer having the film thickness of approximately 10 nm is adopted, is characterized in that transistor characteristics can be controlled by the application of a back bias. R. Tsuchiya et al., "Silicon on Thin BOX: A New Paradigm of The CMOSFET for Low-Power and High-Performance Application Featuring Wide-Range Back-Bias Control", IEDM Tech., 2004, pp 631 recites that the various characteristics, such as the threshold voltage of the transistor, can be controlled when the back bias is applied thereto. R. Tsuchiya et al., "Silicon on Thin BOX: A New Paradigm of The CMOSFET for Low-Power and High-Performance Application Featuring Wide-Range Back-Bias Control", IEDM Tech., 2004, pp 631 also recites that the application of a forward bias does not generate the flow of a junction leak current because the SOI structure is adopted, as a result of which the back bias can be applied in a significantly broad range in comparison to the conventional bulk device.

In a case where a logic circuit and a SRAM memory cell are provided in the semiconductor device, however, it was yet to be clearly known how the back bias should be most suitably applied to operate the device. More specifically, R. Tsuchiya et al., "Silicon on Thin BOX: A New Paradigm of The CMOSFET for Low-Power and High-Performance Application Featuring Wide-Range Back-Bias Control", IEDM Tech., 2004, pp 631 recites the matters relating to the semiconductor device having the thin-film BOX-SOI structure where the logic circuit and the SRAM are formed on one semiconductor substrate, and the back bias, while failing to disclose any technology relating to a semiconductor device where the logic circuit can be operated at a high speed and the SRAM can be stably operated, and a method for controlling such a semiconductor device.

SUMMARY OF THE INVENTION

A main object of the present invention is to provide a semiconductor device having a thin-film BOX-SOI structure and provided with a logic circuit and a memory circuit on one semiconductor substrate, wherein a high-speed operation of a logic circuit and a stable operation of a memory circuit can be both achieved, and a method for controlling the semiconductor device.

According to a first aspect of the present invention, a semiconductor device includes a semiconductor support substrate, an insulation film, a semiconductor layer, a first field-effect transistor, and a second field-effect transistor. The insulation film is formed on the semiconductor support substrate and has a film thickness of at most 10 nm. The semiconductor layer is formed on the insulation film. The first field-effect transistor is formed in an upper surface of the semiconductor layer and has a first gate electrode. The second field-effect transistor is formed in the upper surface of the semiconductor layer and has a second gate electrode. Further, the second field-effect transistor is electrically insulated from the first field-effect transistor by an element insulation film formed in the surface of the semiconductor layer. A first well and a second well are formed on the semiconductor support substrate at least below the first gate electrode. The first well has a second conductivity type and formed in the semiconductor support substrate having a first conductivity type. The second well has the first conductivity type and formed in the first well.

A back bias applied to the first field-effect transistor and a back bias applied to the second field-effect transistor can have polarities different to each other. Therefore, a forward bias can be applied as the back bias of the former transistor, while a backward bias can be applied as the back bias of the latter transistor.

According to a second aspect of the present invention, a method for controlling a semiconductor device is a method for controlling the semiconductor device constituted as described earlier. The first field-effect transistor constitutes a logic circuit. The second field-effect transistor constitutes a memory circuit. Further, the forward bias of the first field-effect transistor is applied to a region of the semiconductor support substrate below the first gate electrode, and the backward bias of the second field-effect transistor is applied to a region of the semiconductor support substrate below the second gate electrode.

When the forward and backward biases are thus applied, the high-speed operation of the logic circuit and the stable operation of SRAM can be both realized.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a graph showing a relationship between polarities of a back bias and variability of a threshold voltage.

FIGS. 6 to 19 are sectional process charts for describing a method for manufacturing the semiconductor device according to First Embodiment.

FIGS. 20 to 25 are illustrations of simulation results for describing the effect of the semiconductor device according to First Embodiment.

DESCRIPTION OF THE PREFERRED EMBODIMENTS

Figure 2:
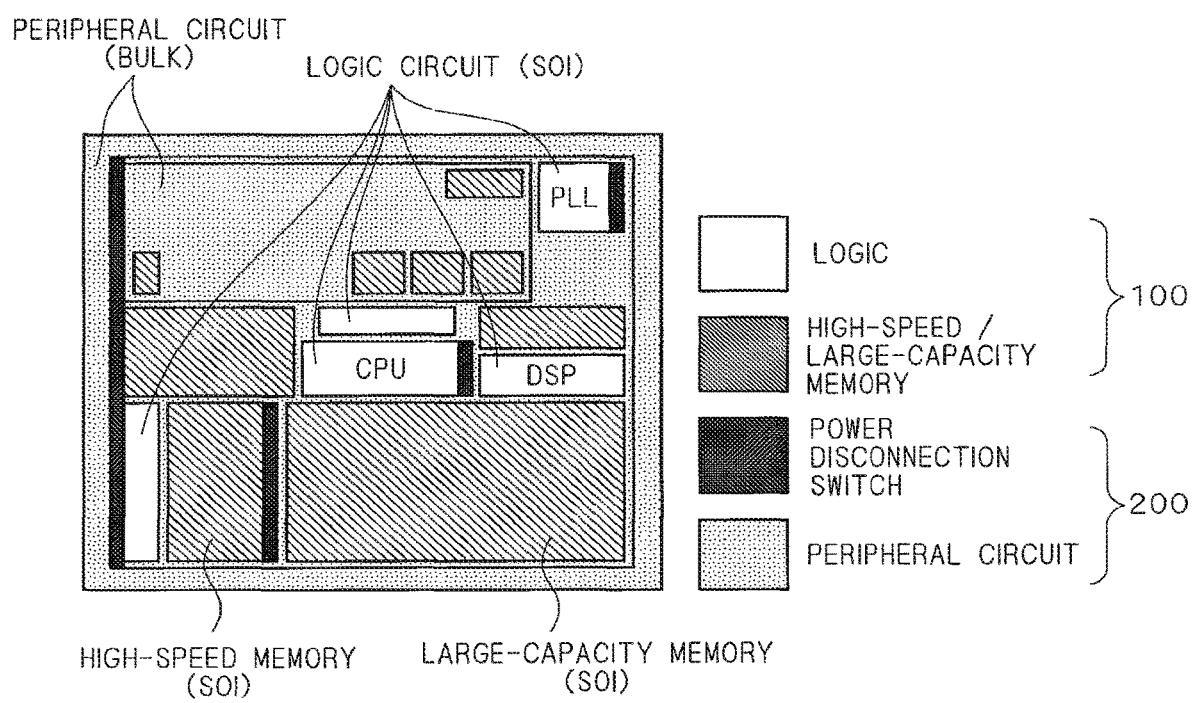
FIG. 2 is a plan view illustrating an example of a schematic constitution of an integrated circuit including a semiconductor device according to the present invention.

The present invention is based on the discovery of new facts which were found out by the inventors of the present invention. The facts are shown in the below.

FIG. 1 illustrates a dependency of variability of a threshold voltage of a transistor on a back bias. The threshold voltage is variable depending on the back bias, and it is already known that the threshold voltage variability increases when a backward bias is applied as the back bias in a case of a conventional bulk device.

In a case of the thin-film BOX-SOI device, the backward bias is generally applied as the back bias. The inventors found out, however, that the threshold voltage variability is lessened, on the contrary, as illustrated in Region A in FIG. 1 (a vertical dimension of the Region A is narrower as the value of the backward bias is larger).

In a case of the conventional bulk device, when a substrate bias is applied, the substrate bias directly affects the variation of a width of a depletion layer below a channel. Therefore, the depletion layer below the channel increases when the backward bias is applied as the back bias, which consequently increases the width of the depletion layer in comparison to the width before the back bias is applied. In other words, the width of the depletion layer extends to further down below the channel. Therefore, not only the width of the depletion layer is increased but also a dopant amount included in the width of the depletion layer is increased in the conventional bulk device. As a result, a dopant charge amount becomes more variable.

When the backward bias is applied as the back bias in the conventional bulk device, a sub threshold coefficient showing a drastic change is obtained. Therefore, the threshold voltage variability resulting from process variability can be reduced.

The contribution of the increase of the threshold voltage variability resulting from the dopant charge variability is larger than the benefit of the reduction of the threshold voltage variability resulting from the process variability in the conventional bulk device. This is the probable reason why the threshold voltage variability increases when the backward bias is applied as the back bias.

The thin-film BOX-SOI, however, has the fully depleted SOI structure. Therefore, the device is operated in a state where the depletion layer below the channel has been extended to the SOI/BOX layer. Therefore, when the backward bias is applied as the back bias, the width of the depletion layer is variable in a smaller range, and the variability of the dopant charge amount is lessened in comparison to the bulk device.

As a result, the contribution of the increase of the threshold voltage variability resulting from the dopant charge variability is reduced, while the benefit of the reduction of the threshold voltage variability resulting from the process variability is increased. When the backward bias is applied as the back bias in a case of the thin-film BOX-SOI, therefore, the reduction of the threshold voltage variability is expected. As illustrated in a lower part in FIG. 1, it was confirmed that the threshold voltage variability was reduced by approximately 16% in a case where the back bias was −1.2V in comparison to the back bias being zero when the backward bias is applied as the back bias in the thin-film BOX-SOI.

The present invention was implemented in order to solve the problems based on the findings described so far. Hereinafter, embodiments of the present invention are described in detail referring to the drawings.

First Embodiment

FIG. 2 illustrates an example of a floor plan of a semiconductor device. A SOI-MISFET (Metal Insulation Semiconductor Field Effect Transistor) 100 is used for the production of a logic circuit for which a high element performance is demanded and a high-speed memory circuit provided with a large capacity. A bulk MISFET 200 is used for the production of a power disconnection switch and peripheral circuits which requires a high pressure-resistant element. As a result, a system LSI (Large Scale Integration) capable of exerting a high performance, which is illustrated in FIG. 2, can be produced.

Figure 3:
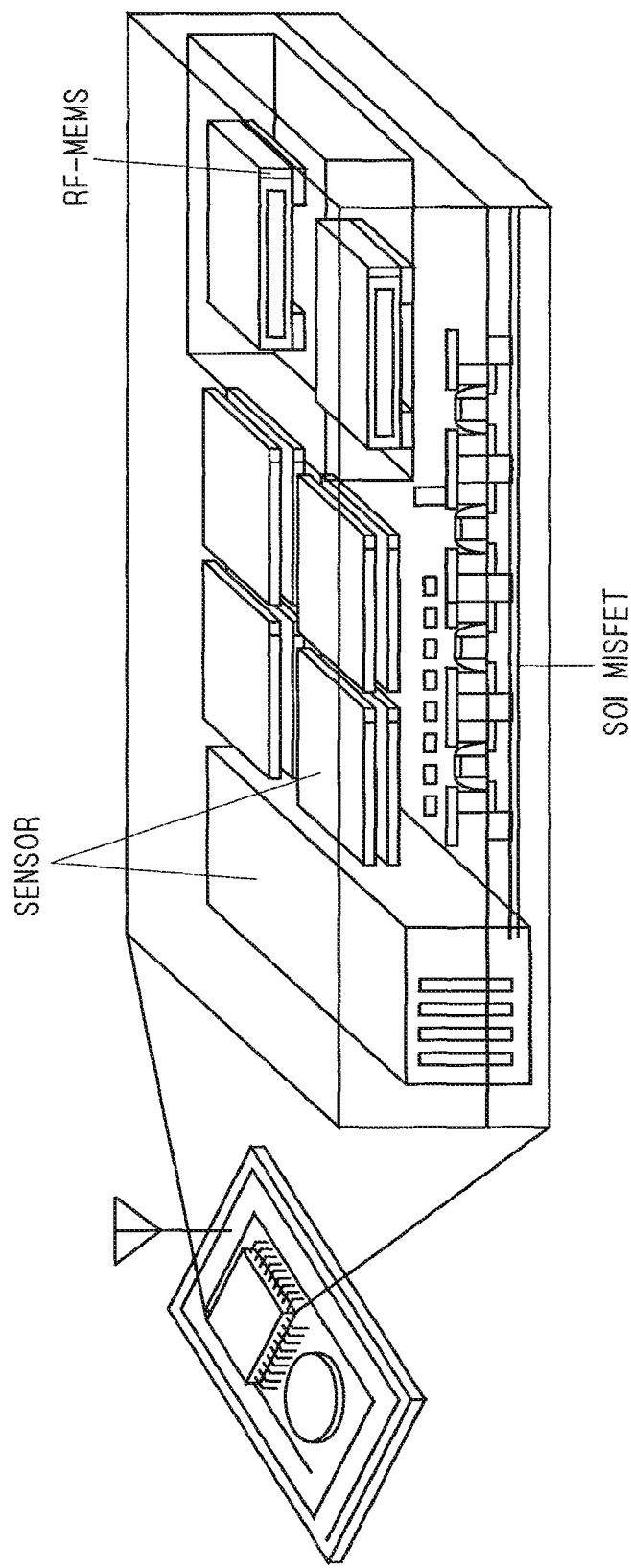
FIG. 3 is a floor chart illustrating the example of the schematic constitution of the integrated circuit including the semiconductor device according to the present invention.

FIG. 3 illustrates an example where MEMS (Micro Electro Mechanical Systems) is also mixedly provided. The SOI-MISFET constitutes the LSI which requires a high-speed processing, and the MEMS such as a RF (Radio Frequency) module and a sensor are formed in a bulk region. As a result, a high-performance integrated circuit provided with the MEMS can be inexpensively provided.

Figure 4:
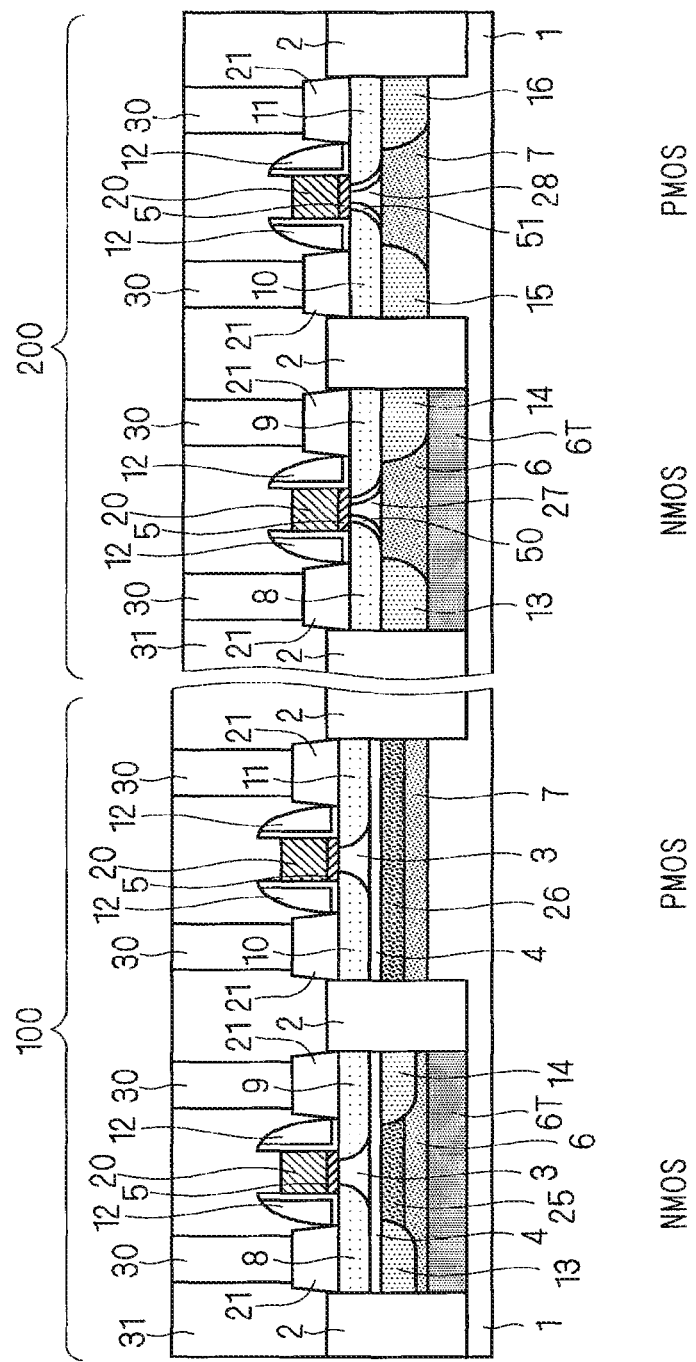
FIG. 4 is a sectional view illustrating an example of a constitution of the semiconductor device according to First Embodiment of the present invention.
Figure 5:
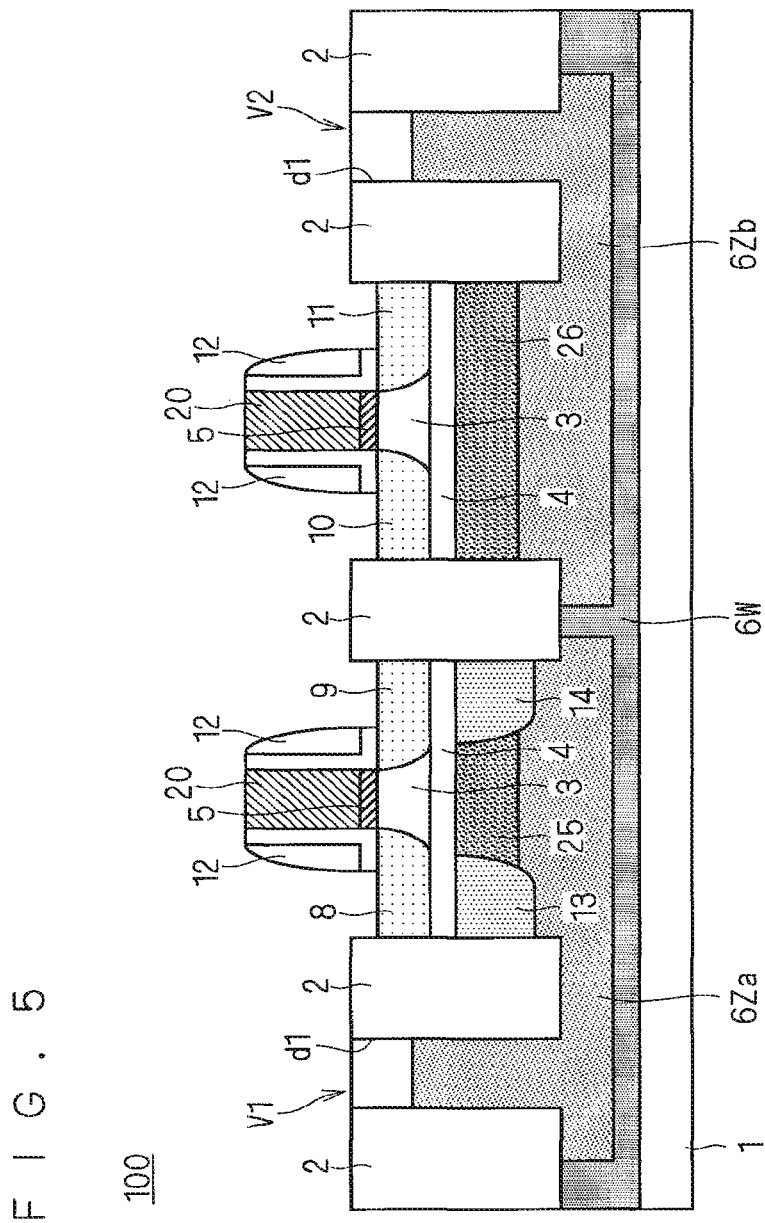
FIG. 5 is a sectional view illustrating another example of the constitution of the semiconductor device according to First Embodiment.

FIG. 4 is a sectional view illustrating constitutions of a SOI-MISFET 100 and a bulk MISFET 200. In FIG. 4, NMOS is on the left side of the SOI-MISFET 100, while PMOS is the right side of the SOI-MISFET 100. Further, NMOS is on the left side of the bulk MISFET 200, while PMOS is on the right side of the bulk MISFET 200. As illustrated in FIG. 5, the both transistors of the SOI-MISFET 100 may be the transistors of the same conductivity type. In FIG. 4, plugs 30 formed in insulation layers 31 are respectively connected to source/drain regions 8 to 11 via silicide films 21. The presence of the silicide films 21 can reduce contact resistances between the plugs 30 and the source/drain regions 8 to 11. FIG. 5 shows a forward back bias V1 and a backward back bias V2.

Next, constitutions of main constituents provided in the SOI-MISFET 100 according to the present embodiment are described.

As illustrated in FIGS. 4 and 5, the SOI-MISFET 100 includes a semiconductor support substrate 1, an insulation film 4, and a semiconductor layer 3. A film thickness of the insulation film 4 formed on the semiconductor support substrate 1 is at most 10 nm. The semiconductor layer 3 is formed on the insulation film (BOX layer) 4.

The transistor on the left side of the SOI-MISFET 100 illustrated in FIGS. 4 and 5 (which can be regarded as a first field-effect transistor) is formed in an upper surface of the semiconductor layer 3, which constitutes a logic circuit. The first field-effect transistor includes the source/drain regions 8 and 9 formed in the surface of the semiconductor layer 3 and a gate structure formed on the semiconductor layer 3. The gate structure includes a gate insulation film 5 formed on the semiconductor layer 3 and a gate electrode 20 (regarded as a first gate electrode) formed on the gate insulation film 5. Side wall films 12 are formed on both side surfaces of the gate structure. The source/drain regions 8 and 9 are formed in the surface of the semiconductor layer 3 on both ends of the first gate electrode 20.

The transistor on the right side of the SOI-MISFET 100 illustrated in FIGS. 4 and 5 (which can be regarded as a second field-effect transistor) is formed in the upper surface of the semiconductor layer 3, which constitutes a memory circuit. The second second-effect transistor includes the source/drain regions 10 and 11 formed in the surface of the semiconductor layer 3 and a gate structure formed on the semiconductor layer 3. The gate structure includes a gate insulation film 5 formed on the semiconductor layer 3 and a gate electrode 20 (regarded as a second gate electrode) formed on the gate insulation film 5. Side wall films 12 are formed on both side surfaces of the gate structure. The first field-effect transistor and the second field-effect transistor are electrically insulated from each other by an element separation film 2. The source/drain regions 10 and 11 are formed in the surface of the semiconductor layer 3 on both ends of the second gate electrode 20.

The dopant concentration of the semiconductor layer 3 (that is a channel region) below the first gate electrode and the second gate electrode is approximately $1\times10^{16}/cm^3$.

Focusing on the semiconductor support substrate 1 of the SOI-MISFET 100 illustrated in FIGS. 4 and 5, a triple well is formed in the semiconductor support substrate 1 below the first gate electrode 20 in the structure illustrated in FIG. 4, while a triple well is formed in the semiconductor support substrate 1 below the first gate electrode 20 and the second gate electrode 20 in the structure illustrated in FIG. 5. The triple well is constituted such that (formed when) a first well of a second conductivity type is formed in the semiconductor support substrate 1 of a first conductivity type and a second well of the first conductivity type is formed in the first well.

In the SOI-MISFET 100 illustrated in FIG. 4, a P-type well region 6T and an N-type well region 6 are formed in this order from downward in the N-type semiconductor support substrate 1 below the first gate electrode 20. A P-type well region 7 is formed in the N-type semiconductor support substrate 1 below the second gate electrode 20. As illustrated in FIG. 4, the region of the semiconductor support substrate 1 below the first gate electrode 20 and the region of the semiconductor support substrate 1 below the second gate electrode 20 can be electrically separated from each other as a result of the formation of the wells 6, 6T and 7 (formation of the triple well).

In the SOI-MISFET 100 illustrated in FIG. 5, an N-type well region. 6W and P-type well regions 6Za and 6Zb are formed in this order from downward in the P-type semiconductor support substrate 1 below the first gate electrode 20 and the P-type semiconductor support substrate 1 below the second gate electrode 20. The well region 6Za and the well region 6Zb are electrically separated from each other as illustrated in FIG. 5. As illustrated in FIG. 5, therefore, the region of the semiconductor support substrate 1 below the first gate electrode 20 and the region of the semiconductor support substrate 1 below the second gate electrode 20 can be electrically separated from each other as a result of the formation of the wells 6W, 6Za and 6Zb (formation of the triple well).

In FIG. 5, the forward bias of the first field-effect transistor is applied to the well region 6Za as the back bias via the element separation film 2. On the contrary, the backward bias of the second field-effect transistor is applied to the well region 6Zb as the back bias in FIG. 5.

Though not specifically illustrated in FIG. 4, the forward bias of the first field-effect transistor is applied to the well region 6 as the back bias. On the contrary, the backward bias of the second field-effect transistor is applied to the well region 7 as the back bias.

Focusing on the semiconductor support substrate 1 below the first gate electrode 20 in the SOI-MISFET 100 illustrated in FIG. 4, dopant regions 13 and 14 having the conductivity type different to that of the well region 6, which are formed in the surface of the semiconductor support substrate 1 below the source/drain regions 8 and 9, are provided on the semiconductor support substrate 1. Focusing on the semiconductor support substrate 1 below the first gate electrode 20 in the SOI-MISFET illustrated in FIG. 5, dopant regions 13 and 14 having the conductivity type different to that of the well region 6Za, which are formed in the surface of the semiconductor support substrate 1 below the source/drain regions 8 and 9, are provided on the semiconductor support substrate 1.

In the dopant regions 13 and 14, the dopant concentration is approximately $1\times10^{18}/cm^3$.

In the SOI-MISFET 100 illustrated in FIG. 4, a dopant region 25 for adjusting the threshold voltage of the first field-effect transistor is formed in the surface of the semiconductor support substrate 1 below the first gate electrode 20. A dopant region 26 for adjusting the threshold voltage of the second field-effect transistor is formed in the surface of the semiconductor support substrate 1 below the second gate electrode 20. The conductivity type of the dopant region 25 is the same as that of the well region 6. The conductivity type of the dopant region 26 is the same as that of the well region 7. However, the dopant concentration of the dopant region 26 is lower than that of the dopant region 25.

In the SOI-MISFET 100 illustrated in FIG. 5, a dopant region 25 for adjusting the threshold voltage of the first field-effect transistor is formed in the surface of the semiconductor support substrate 1 below the first gate electrode 20. A dopant region 26 for adjusting the threshold voltage of the second field-effect transistor is formed in the surface of the semiconductor support substrate 1 below the second gate electrode 20. The conductivity type of the dopant region 25 is the same as that of the well region 6Za. The conductivity type of the dopant region 26 is the same as that of the well region 6Zb. However, the dopant concentration of the dopant region 26 is lower than that of the dopant region 25.

The dopant concentration of the dopant region 25 is approximately $1 \times 10^{18}/cm^3$, and the dopant concentration of the dopant region 26 is approximately $1 \times 10^{17}/cm^3$.

Next, a process for manufacturing the constitution illustrated in FIG. 5 is briefly described below.

In FIG. 5, the element separation film 2 and the wells 6W, 6Za and 6Zb are formed according to a conventional method. The back biases having different polarities are applied to the respective transistors so that the device is operated. In the formation of the wells, the triple wells described earlier are formed in the semiconductor support substrate 1 below the respective gate electrodes 20. Accordingly, the well regions 6Za and 6Zb are electrically separated from each other, and therefore, the back biases having the different polarities can be applied to the respective transistors. Further, the flow of a leak current is prevented in the semiconductor support substrate 1 though the forward bias is applied on the triple-well-structure side.

Then, ions are implanted for adjusting the threshold voltage (ion implantation for the formation of the dopant regions 25 and 26). At the time, the ions are implanted at a desired dopant concentration in the first field-effect transistor so that the threshold voltage of the first field-effect transistor is equal to a targeted threshold voltage. The ions are implanted at a dopant concentration lower than the desired dopant concentration in the second field-effect transistor. Accordingly, the threshold voltage of the second field-effect transistor is increased in a state where the backward bias is applied to the second field-effect transistor as the back bias.

As described earlier, the dopant concentration of the dopant region 26 is set to be lower. Therefore, the threshold voltage variability, which results from the dopant concentration, can be more effectively prevented from increasing in the second field-effect transistor.

Then, the gate structures 5 and 20 are formed, extension ions are implanted, and the side wall films 12 are formed. After the formation of the side wall films 12, the epitaxial growth is utilized so that silicon is grown in a diffusion layer region, and the source/drain regions 8, 9, 10 and 11 are thereafter formed. At the time, the dopant is introduced into the layers below the insulation film 4 only in the region where the first field-effect transistor is formed in order to reduce a junction capacitance. More specifically, as illustrated in FIG. 5, the dopant regions 13 and 14 are formed in the surface of the semiconductor support substrate 1 below the electrode-utilizing regions 8 and 9 constituting the first field-effect transistor.

The purpose of the formation of the dopant regions 13 and 14 is to reduce the concentration of the dopant introduced into the layers below the insulation film 4. Therefore, the ion implantation for the formation of the dopant regions 13 and 14 is performed at the dopant concentration equal to that of the dopant region 25. As described earlier, the conductivity type of the dopant of the dopant region 25 and the conductivity type of the dopant of the dopant regions 13 and 14 are different to each other. Thus, the dopant of the predetermined conductivity type is introduced into the layers below the insulation layer 4 so that the junction capacitance is reduced.

In the introduction of the dopant, the gate structures and the side wall films 12 are respectively used as a mask, and a depth at which the dopant is introduced is adjusted. Thus, the dopant can be continuously introduced for the reduction of the junction capacitance after the implantation of the ions implemented for the formation of the source/drain regions. Therefore, the increase of the masks due to the additional dopant introduction for the reduction of the junction capacitance can be prevented. After that, a conventional manufacturing flow of the semiconductor device is performed so that the manufacturing of the semiconductor element is completed.

Next, a process for manufacturing the structure illustrated in FIG. 4 is described in detail referring to sectional process charts.

A semiconductor substrate having a main surface mirror-polished and consisting of monocrystalline Si, in which plane direction is (100), conductivity type is P, resistivity is 10 ohm·cm, and diameter is 20 cm, is prepared, and a silicon thermally-oxidized film having the thickness of 10 nm is formed on the semiconductor substrate. After that, hydrogen ions are implanted into the semiconductor substrate on which the silicon thermally-oxidized film is formed according to a conventional process for manufacturing an ultra-thin film SOI substrate. An amount of the implanted ions was $5 \times 10^{16}/cm^2$. As a result of the ion implantation, a crystalline defective layer is formed at the depth of approximately 40 nm from the main surface of the monocrystalline Si substrate. Then, a hydrophilizing treatment is performed to a first semiconductor substrate not provided with the silicon oxide film on a surface thereof and a second semiconductor substrate having the same specification, and main surfaces of the substrates are thereafter bonded to each other at room temperature.

Next, the two Si substrates bonded to each other are heated to 500° C. As a result of the heat treatment, very small holes are generated and further increased in the crystalline defective layer, and the monocrystalline Si substrate is detached at the crystalline defective layer. Accordingly, a silicon thermally-oxidized film (insulation film) 4 having the thickness of 10 nm is bonded to the semiconductor support substrate 1, and a monocrystalline Si thin film (semiconductor layer) 3 having the thickness of approximately 20 nm is bonded to the insulation film 4. Then, a heat treatment at 1,100° C. is performed to the resulting substrate. As a result, a bonding strength between the insulation film 4 and the semiconductor support substrate 1 is significantly improved, which is equivalent to a bonding strength in a conventional monocrystalline substrate.

Figure 6:
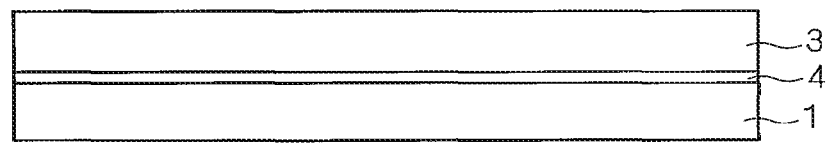

Then, the surface of the semiconductor layer 3, that is the detached surface, is mirror-polished according to a surface polishing process in which grains are not included, and a SOI substrate illustrated in FIG. 6 can be thereby prepared. As is learnt from FIG. 6, the semiconductor support substrate 1, insulation film 4 and semiconductor layer 3 are multilayered in this order from downward, and the SOI substrate can be obtained. The film thickness of the insulation film (BOX layer) 4 is at most 10 nm. The semiconductor support substrate 1 has the N-type conductivity type.

A substrate commercially available having similar specifications may be purchased as the SOI substrate illustrated in FIG. 6. In that case, the silicon oxide film is formed on the SOI substrate, and the silicon oxide film is then removed, so that the Si layer can be thinned until a desired monocrystalline Si layer is obtained. As an alternative process which can be adopted, the SOI structure is formed on a bulk substrate by means of the epitaxial thin film growth technology such as ELO (Epitaxial Lateral Overgrowth or SPE (Solid Phase Epitaxiy).

Figure 7:
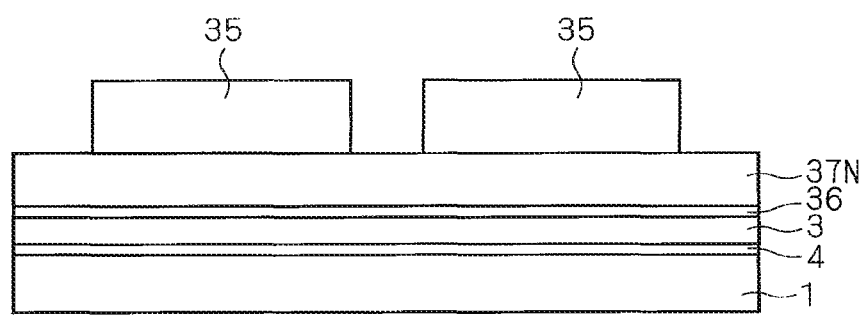

In the constitution illustrated in FIG. 6, a silicon oxide film 36 and a silicon nitride film 37N are formed in this order (FIG. 7). The formed silicon nitride film 37N is used as a polishing stopper in chemical and mechanical polishing when a shallow groove element is separately formed later.

Figure 8:
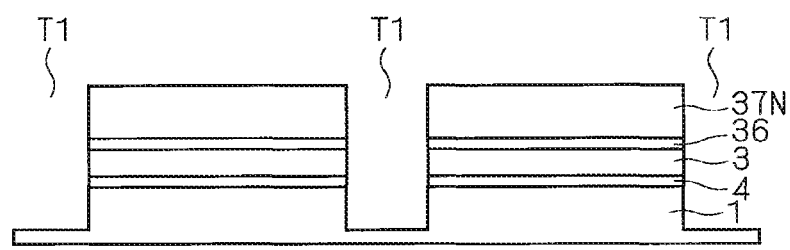

Next, a resist mask 35 is applied, and then, only the resist mask 35 in a desired region is removed (FIG. 7). In other words, the resist mask 35 is retained only in an upper section of an active area in a transistor formed later. After that, the resist mask 35 is used as a mask, so that part of the silicon nitride film 37N, silicon oxide film 36, semiconductor layer 3, insulation film 4 and semiconductor support substrate 1 in the desired region is removed (FIG. 8). As a result, a trench T1 for the formation of the element separation film 2 is formed as illustrated in FIG. 8.

Then, the silicon oxide film is formed on the structure illustrated in FIG. 8 so that the trench T1 is filled therewith. After that, the silicon oxide film and the silicon nitride film 37N are polished. Accordingly, the element separation film 2 is formed in the trench T1, and the silicon nitrided film 37N is removed as illustrated in FIG. 9. In the presence of the element separation film 2, the transistors formed adjacent to each other are electrically separated from each other.

Next, the ion implantation for the formation of the P-type well region 6T and the ion implantation for the formation of the N-type well region 6 are implemented to an NMOS formation region in a structure illustrated in FIG. 9, while the ion implantation for the formation of the P-type well region 7 is implemented to a PMOS formation region in the structure illustrated in FIG. 9. As illustrated in FIG. 10, the triple well consisting of the well regions 6 and 6T is formed in the semiconductor support substrate 1 in the NMOS formation region, while only the well region 7 is formed in the semiconductor support substrate 1 in the PMOS formation region.

In the semiconductor support substrate 1 at least below the gate electrode 20, the triple well, in which the first well of the second conductivity type is formed in the semiconductor support substrate of the first conductivity type, and the second well of the first conductivity type is formed in the first well, is formed. As a result of the formation of the triple well, the region of the semiconductor support substrate 1 below the first gate electrode 20 and the region of the semiconductor support substrate 1 below the second gate electrode 20 can be electrically separated from each other.

As described earlier, the first gate electrode 20 is a constituent element of the first field-effect transistor (transistor on the left side of the region 100 illustrated in FIG. 4) which constitutes the logic circuit. The second gate electrode 20 is a constituent element of the second field-effect transistor (transistor on the right side of the region 100 illustrated in FIG. 4) which constitutes the memory circuit.

Figure 11:
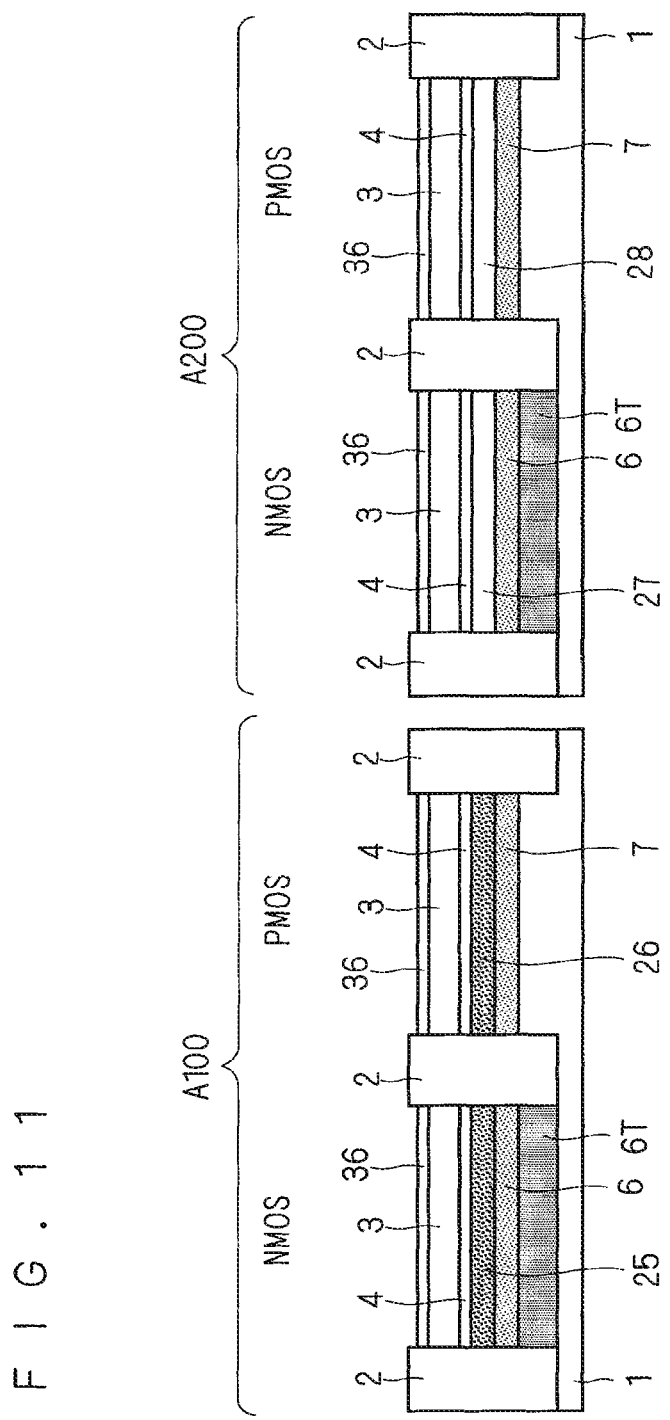

Next, the dopant ions of the N-type are implanted into an NMOS formation region of a SOI-MISFET formation region A100 in a structure illustrated in FIG. 10. Accordingly, the dopant region 25 is formed in the surface of the semiconductor support substrate 1 in the NMOS formation region of the SOI-MISFET formation region A100 as illustrated in FIG. 11. The dopant region 25 is a region for adjusting the threshold voltage of the NMOS transistor (can be regarded as the first field-effect transistor). Further, the dopant ions of the P-type are implanted into the PMOS formation region of the SOI-MISFET formation region A100 in the structure illustrated in FIG. 10. Accordingly, the dopant region 26 is formed in the surface of the semiconductor support substrate 1 in the PMOS formation region of the SOI-MISFET formation region A100 as illustrated in FIG. 11. The dopant region 26 is a region for adjusting the threshold voltage of the PMOS transistor (can be regarded as the second field-effect transistor).

As a result of the respective ion implantations, the dopant concentration in vicinity of the surface of the semiconductor support substrate 1 below the gate electrode 20 constituting the second field-effect transistor is lower than the dopant concentration in vicinity of the surface of the semiconductor support substrate 1 below the gate electrode 20 constituting the first field-effect transistor.

Further, the dopant ions of the N-type are implanted into an NMOS formation region of a bulk MISFET formation region A200 in the structure illustrated in FIG. 10. Accordingly, a dopant region 27 is formed in the surface of the semiconductor support substrate 1 in the NMOS formation region of the bulk MISFET formation region A200 as illustrated in FIG. 11. The dopant region 27 is a region for adjusting the threshold voltage of the NMOS transistor. Further, the dopant ions of the P-type are implanted into a PMOS formation region of the bulk MISFET formation region A200 in the structure illustrated in FIG. 10. Accordingly, a dopant region 28 is formed in the surface of the semiconductor support substrate 1 in the PMOS formation region of the bulk MISFET formation region A200 as illustrated in FIG. 11. The dopant region 28 is a region for adjusting the threshold voltage of the PMOS transistor.

In the sectional process charts illustrated in FIGS. 6 to 10, the SOI-MISFET formation region A100 and the bulk MISFET formation region A200 are base on the same flow, and therefore, they were described referring to the common sectional process charts. In and after FIG. 11, the SOI-MISFET formation region A100 and the bulk MISFET formation region A200 are separately illustrated and described so that they can be easily understood.

Figure 12:
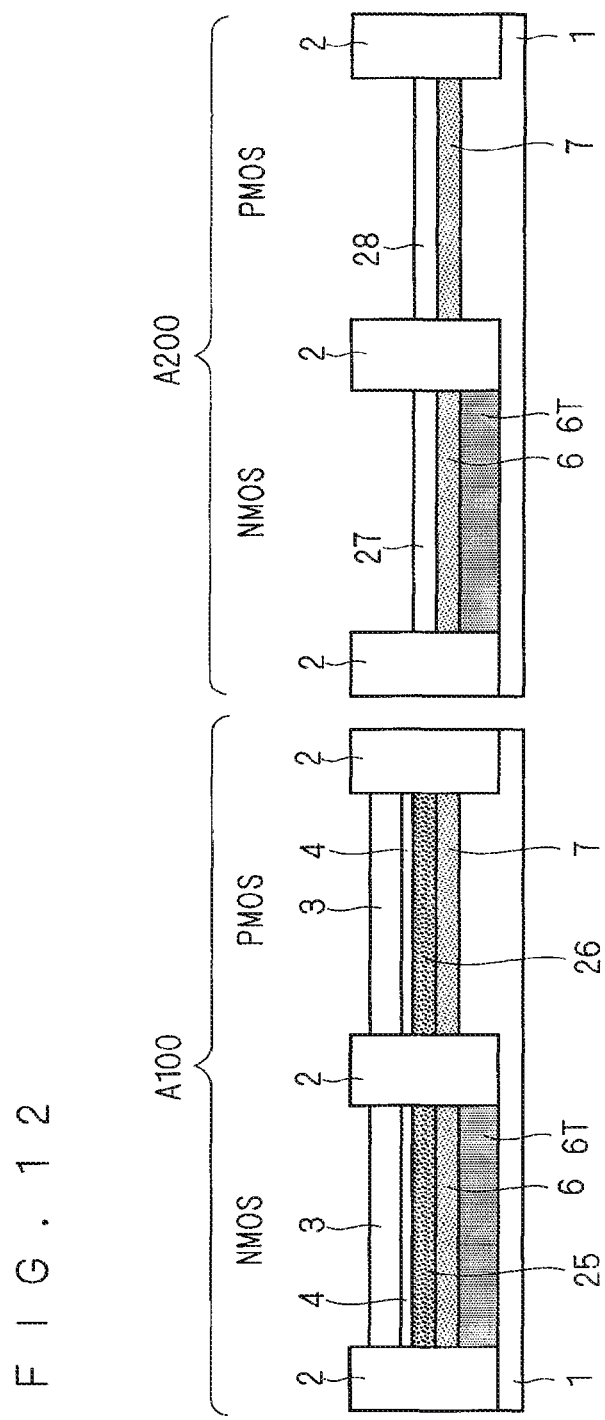

The silicon oxide film 36, semiconductor layer 3 and insulation layer 4, which are formed in the bulk MISFET formation region A200, are removed. At the same time as the removal, the silicon oxidized film 36, the semiconductor layer 3 and insulation layer 4, which are formed in back bias feeders (reference symbol d1 in FIG. 5) formed in the SOI-MISFET formation region A100, are removed. Then, the residual silicon oxide film 36 is cleaned with hydrofluoric acid to be selectively removed. Accordingly, an upper surface of the semiconductor layer 3 is exposed out of an active region of the SOI-MISFET formation region A100, while the semiconductor support substrate 1 is exposed out of an active area of the bulk MISFET formation region A200 as illustrated in FIG. 12.

When the semiconductor layer 3, insulation layer 4 and the like in the back bias feeders are removed and the semiconductor layer 3, insulation layer 4 and the like in the bulk MISFET formation region A200 are removed at the same time as described, the process can be simplified. Any sectional process chart for vicinity of the region where the back bias feeders are formed is not shown.

Then, the thermally-oxidized film is formed in the thickness of 1.8 nm, and a surface thereof is nitrided with NO gas so that the nitride film is formed in the thickness of 0.2 nm on the main surface, and then, the gate insulation film 5 is formed. Further, a polycrystalline Si film having the thickness of, for example, 100 nm is deposited on the gate insulation film 5 by means of the chemical vapor deposition.

Figure 13:
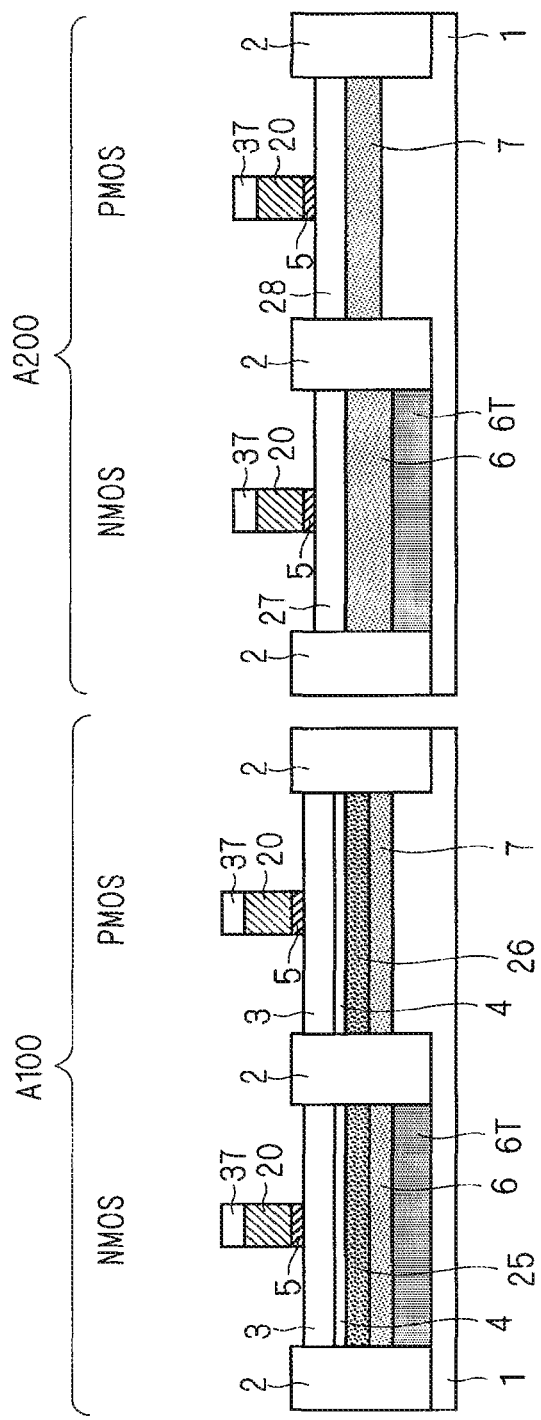

Then, a gate protective film, in which a silicon nitride film is mainly used, is deposited on the polycrystalline film, and the gate structures 5 and 20 and a gate protective film 37 are subjected to patterning according to the conventional process for manufacturing the MISFET (FIG. 13). The gate structure is a multilayered structure in which the gate insulation film 5 and the gate electrode 20 made of polycrystalline Si are provided in this order.

Figure 14:
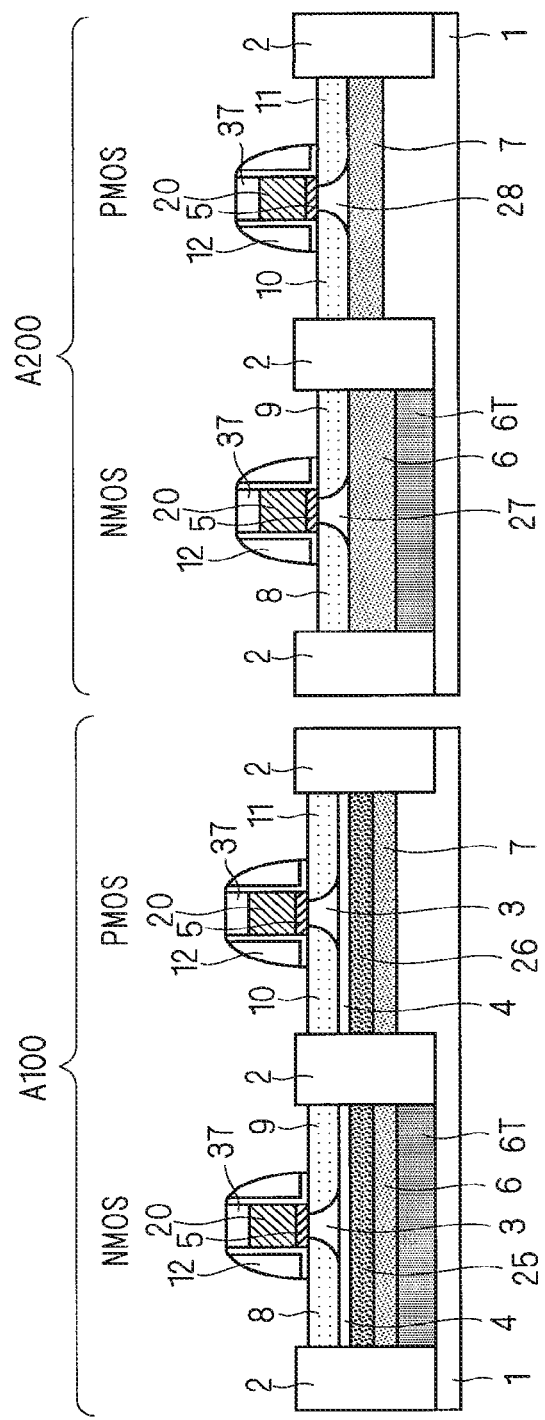

Next, As ions, for example, are implanted into the NMOS formation regions of the regions A100 and A200. In order to control a distance (Lov) between end portions of the source/drain regions 8 to 11 and end portions of the gate electrodes 20, offset spacers 12 formed such that an oxide film is deposited and etched back may be provided before the implantation of the As ions. The spacer 12 may be formed such that the oxide film is simply deposited but not etched back. In either case, the distance (Lov) can be controlled by a film thickness of the deposited oxide film. As a result, the N-type source/drain regions 8 and 9 are formed in the surface of the semiconductor layer 3 in the NMOS formation region of the SOI-MISFET formation region A100 as illustrated in FIG. 14. Further, the N-type source/drain regions 8 and 9 are formed in the surface of the semiconductor support substrate 1 in the NMOS formation region of the bulk MISFET formation region A200. The each of source/drain regions 8 and 9 is formed on both ends of the gate electrodes present in the respective NMOS regions. The spacers 12 having a double structure are formed on both ends of the gate electrode 20.

For example, BF2 ions are implanted into the PMOS formation regions of the regions A100 and A200. Then, the P-type source/drain regions 10 and 11 are formed in the surface of the semiconductor layer 3 in the PMOS formation region of the SOI-MISFET formation region A100, and the P-type source/drain regions 10 and 11 are formed in the surface of the semiconductor support substrate 1 in the PMOS formation region of the bulk MISFET formation region A20, as illustrated in FIG. 14. The each of source/drain regions 10 and 11 is formed on both ends of the gate electrodes present in the respective PMOS regions.

Figure 15:
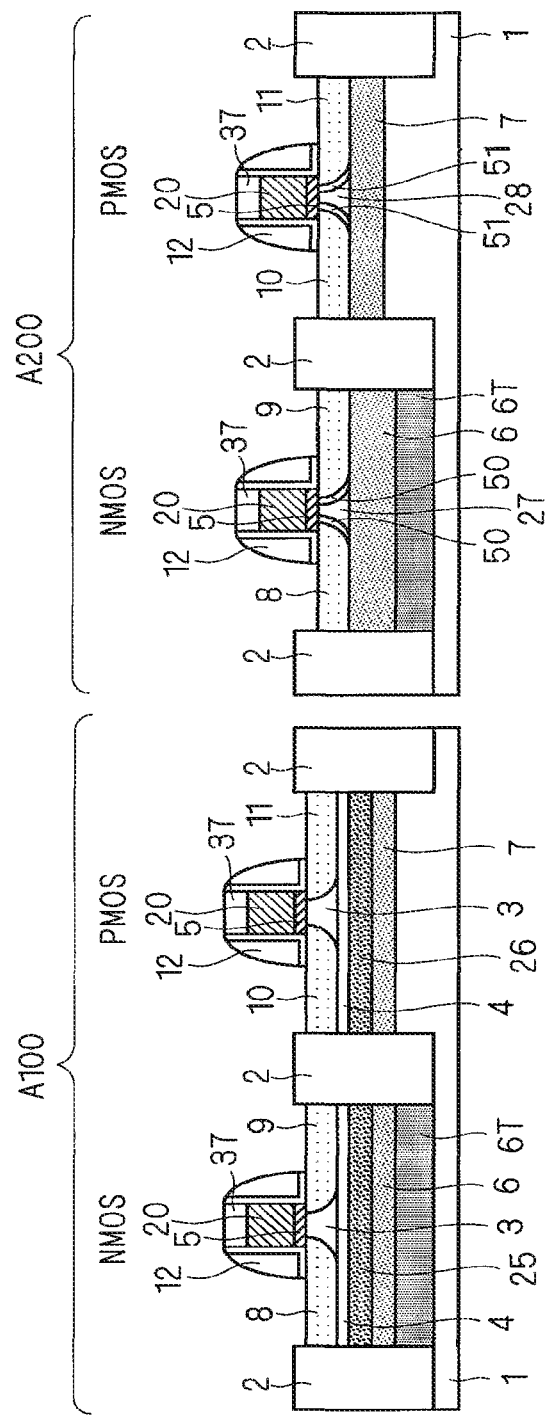

For example, B (boron) ions are implanted into the NMOS formation region of the bulk MISFET formation region A200, and halo regions 50 are thereby formed in the surface of the semiconductor support substrate 1 in vicinity below the gate electrode 20 present in the NMOS formation region (FIG. 15). For example, P (phosphorous) ions are implanted into the PMOS formation region of the bulk MISFET formation region A200, and halo regions 51 are thereby formed in the surface of the semiconductor support substrate 1 in vicinity below the gate electrode 20 present in the PMOS formation regions (FIG. 15). The halo regions 50 and 51 are formed to control the short-channel effect of the bulk MISFET. For example, the ions can be tiltingly implanted at the angle of 20 degrees for the formation of the halo regions without any problem in order to more effectively control the short-channel effect.

The silicon oxide film is formed on an upper surface of a structure illustrated in FIG. 15. After that, an anisotropic dry etching is performed to the formed silicon oxide film, and the side wall film 12 is formed in the side wall of each gate electrode 20 (FIG. 16).

Figure 16:
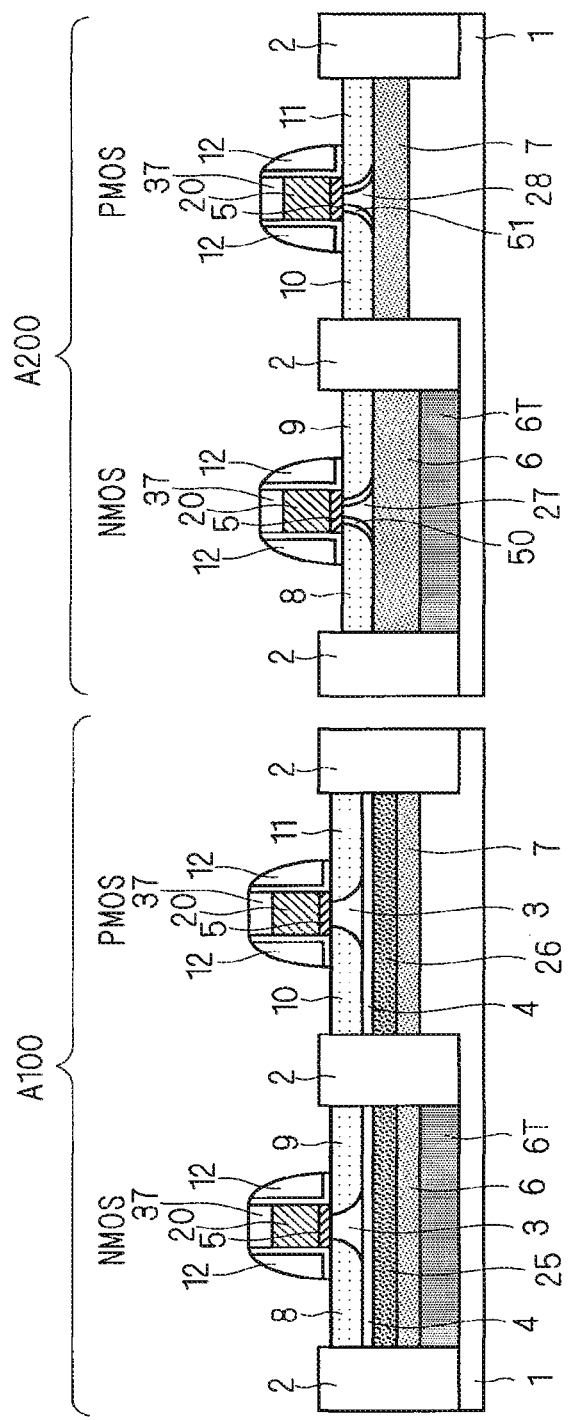

Then, in a structure illustrated in FIG. 16, the P-type dopant ions are implanted into the NMOS formation region of the SOI-MISFET formation region A100 and the NMOS formation region of the bulk MISFET formation region A200. When the dopant ions are implanted, the gate electrodes 20 provided with the side wall films 12 on the side wall surfaces thereof respectively function as a mask.

Figure 17:
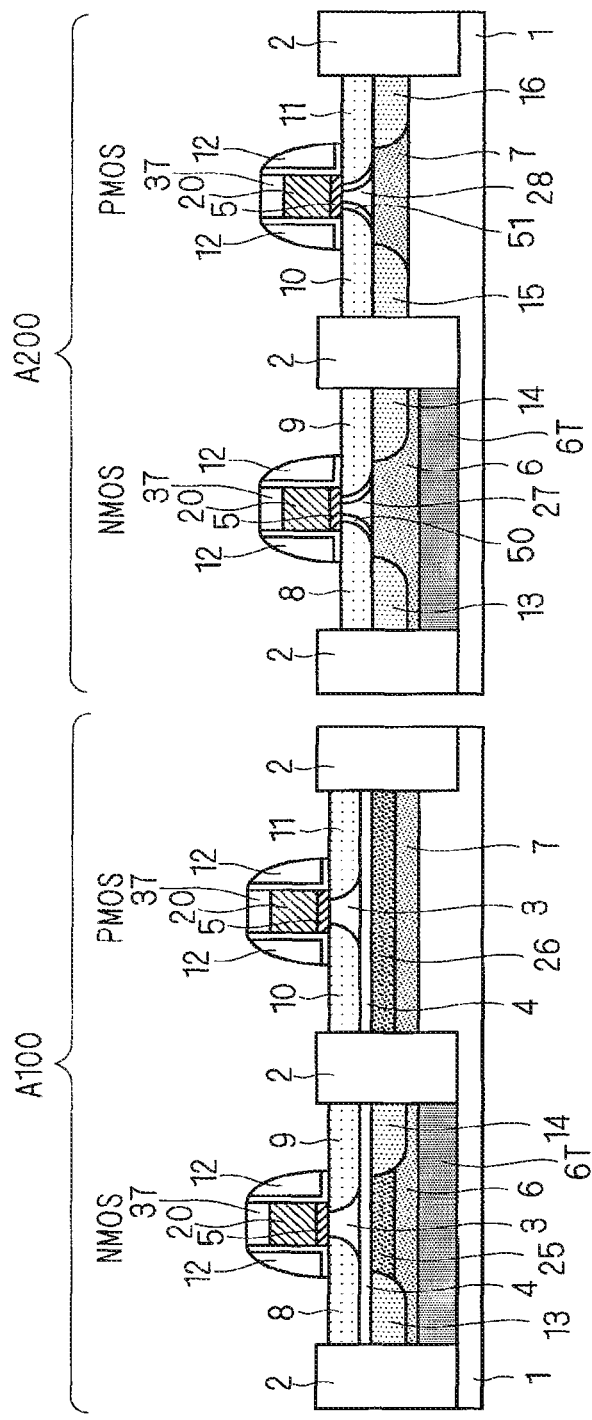

As a result of the implantation of the dopant ions, the P-type dopant regions 13 and 14 are formed in the surface of the semiconductor support substrate 1 in the NMOS formation region of the SOI-MISFET formation region A100 as illustrated in FIG. 17. Because the dopant ions are implanted with the gate electrode 20 functioning as the mask, the dopant regions 13 and 14 are formed below the source/drain regions 8 and 9. The dopant concentration of the dopant regions 13 and 14 is substantially equal to that of the well region 6, and the conductivity type of the dopant in the dopant regions 13 and 14 is different to that of the dopant in the well region 6.

As a result of the implantation of the dopant ions, the P-type dopant regions 13 and 14 are formed in the surface of the semiconductor support substrate 1 in the NMOS formation region of the bulk MISFET formation region A200 as illustrated in FIG. 17. Because the dopant ions are implanted with the gate electrode 20 functioning as the mask, the dopant regions 13 and 14 are formed immediately below the source/drain regions 8 and 9. More specifically, the source/drain regions 8 and 9 and the dopant regions 13 and 14 constitute a source/drain region having a double stage structure. The dopant concentration of the dopant regions 13 and 14 is substantially equal to that of the well region 6, and the conductivity type of the dopant in the dopant regions 13 and 14 is different to that of the dopant in the well region 6.

Then, in the structure illustrated in FIG. 16, the N-type dopant ions are implanted into the PMOS formation region of the bulk MISFET formation region A200. When the N-type dopant ions are implanted, the gate electrode 20 provided with the side wall film 12 on the side wall surface thereof functions as a mask.

As a result of the implantation of the N-type dopant ions, N-type dopant regions 15 and 16 are formed in the surface of the semiconductor support substrate 1 in the PMOS formation region of the bulk MISFET formation region A200 as illustrated in FIG. 17. Because the N-type dopant ions are implanted with the gate electrode 20 functioning as the mask, the dopant regions 15 and 16 are formed immediately below the source/drain regions 10 and 11. More specifically, the source/drain regions 10 and 11 and the dopant regions 15 and 16 constitute a source/drain region having a double stage structure. The dopant concentration of the dopant regions 15 and 16 is substantially equal to that of the well region 7, and the conductivity type of the dopant in the dopant regions 15 and 16 is different to that of the dopant in the well region 7.

The dopant regions 13 and 14 are formed in order to reduce a capacitance resulting from the source/drain regions 8 and 9 in the NMOS of the SOI-MISFET formation region A100 according to a manufacturing method similar to a conventional method for reducing the junction capacitance of the bulk MISFET. More specifically, its object is to implant the ions having the opposite conductivity type at such a concentration and an accelerated energy that can compensate for the implanted ions for adjusting the threshold voltage which were implanted earlier according to the ion implantation in which an injection element mask is used so as to form a dopant compensated region approximate to an intrinsic dopant region. In the bulk MISFET formation region A200, the dopant regions 13 and 14 are formed in order to from the source/drain region having the double stage structure in which a resistance is low.

As described, the ion implantation for the reduction of the parasitic capacitance in the SOI-MISFET formation region A100 and the ion implantation for reducing the resistance in the source/drain region in the bulk MISFET formation region A200 can be performed in the common process under the same conditions. As a result, the process can be simplified.

After that, an opening serving as a back bias feeder, through which the back bias is applied to the well region, is formed in the SOI-MISFET formation region, though not shown in the sectional process chart.

Figure 18:
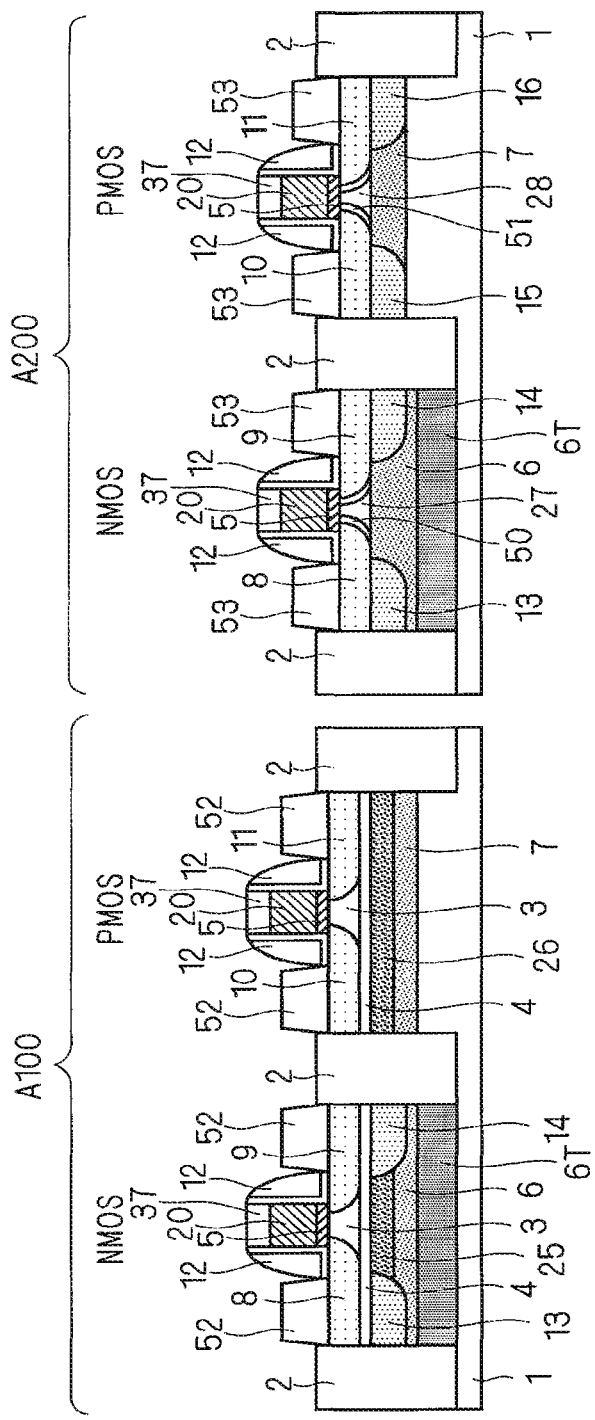

Next, Si films 52 and 53 are selectively grown, for example, in the thickness of 60 nm on the exposed monocrystalline Si region by means of the selective epitaxial process. As a result, in the SOI-MISFET formation region A100, the epitaxially-grown films 52 are formed on the each source/drain region 8 to 11 as illustrated in FIG. 18. In the bulk MISFET formation region A200, the epitaxially-grown films 53 are formed on the each source/drain region 8 to 11. The epitaxially-grown film may also be formed at a bottom section of the opening serving as the feeder.

Figure 19:
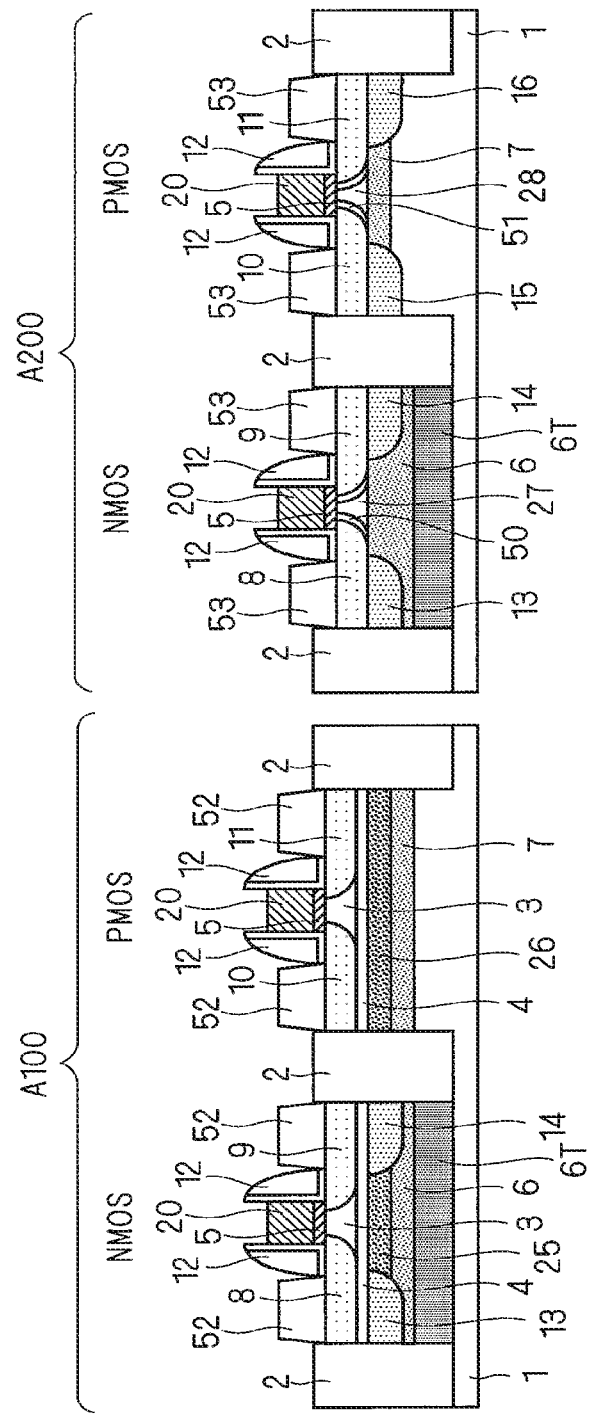

In the structure illustrated in FIG. 18 in which the gate protective film 37 is removed, an Ni (nickel) film having the thickness of 30 nm is formed by means of the sputtering only in the bulk MISFET formation region A200, and a heat treatment is applied thereto to generate a siliciding reaction. As a result, only the each respective gate electrode 20 and each epitaxially-grown film 53 in the bulk MISFET formation region A200 are silicided as illustrated in FIG. 19. After the siliciding reaction, only the unreacted Ni film is selectively removed by an etching solution in which hydrochloric acid and hydrogen peroxide water are mixed.

After that, an inter-wiring insulation film is deposited and polished to be flattened, and a wiring step including the inter-wiring insulation film 31, or the like, is implemented. As a result, the manufacturing of a semiconductor device including the structure illustrated in FIG. 4 is completed.

In the structures illustrated in FIGS. 4 and 5, the forward bias is applied to the logic unit as the back bias, while the backward bias is applied to the memory unit as the back bias.

Accordingly, the junction capacitance generated in the transistor can be reduced in the logic unit, while the concentration of the dopant region 26 for adjusting the threshold voltage of the transistor can be reduced in the memory unit. When the respective back biases are applied so that the semiconductor device is operated, therefore, the logic unit can achieve a high-speed operation, and the memory unit can achieve a stable operation.

Next, effects of the semiconductor device according to the present embodiment are described referring to simulation results and the like. FIG. 20 illustrates a parasitic capacitance reduction effect (high-speed operation effect) in the delay of an inverter along with the formation of the dopant regions 13 and 14. A horizontal axis shown in FIG. 20 indicates a gate voltage (V) of the first field-effect transistor, while a vertical axis indicates an operation speed (ps) of the same transistor. "w/o conter inp." is a calculation result in a case where the dopant regions 13 and 14 are not formed in the structures illustrated in FIGS. 4 and 5 in which the thickness of the insulation layer 4 is 10 nm (hereinafter, simply referred to as structure with no dopant region). Further, "with conter inp." is a calculation result in a case where the dopant regions 13 and 14 are formed in the structures illustrated in FIGS. 4 and 5 (hereinafter, simply referred to as structure with dopant region). Further, curved line data is a calculation result in a case of a conventional SOI structure in which the thickness of the insulation layer 4 is at least several hundreds nm (hereinafter, simply referred to as conventional structure).

As is learnt from FIG. 20, in a case where the constitutions illustrated in FIGS. 4 and 5 wherein the dopant regions 13 and 14 are provided are adopted, the operation speed of the first field-effect transistor constituting the logic circuit can be increased. For example, the operation speed in the structure provided with dopant region is increased by approximately 10% in comparison to the operation speed in the structure provided with no dopant region. In other words, the delay of the inverter can be reduced by approximately 10% in the structure provided with dopant region in comparison to the structure provided with no dopant region.

The operation speed of the first field-effect transistor is thus increased in the semiconductor device according to the present embodiment probably because of the following reason. The operation speed of the transistor is reduced when a parasitic capacitance Cj is increased, and increased when a transistor drive current Ids is increased.

As illustrated in FIG. 21, the parasitic capacitance generated in the transistor shows a smallest value in the conventional structure, a second smallest value in the structure with dopant region, and then, a largest value in the structure with no dopant region. Therefore, it is known that the delay of the inverter can be reduced in the structure with dopant region in comparison to the structure with no dopant region. However, the result of FIG. 20 showing that the delay of the inverter can be reduced in the structure with dopant region in comparison to the conventional structure cannot be explained based on the data shown in FIG. 21. Below is given a description.

In the conventional structure, it is difficult to control the short channel effect generated when the transistor is miniaturized, which makes it necessary to increase the dopant concentration in the semiconductor layer 3. However, according to the study result by the inventors, an off-leak current is significantly increased by the short channel effect when the dopant concentration in the semiconductor layer 3 is reduced (data of Noi=intrinct in FIG. 22) in a case where the conventional structure is adopted. Therefore, it becomes necessary to increase the dopant concentration of the semiconductor layer 3 to at least $10^{18}$ $cm^{-3}$ in order to realize an off-leak current (to $10^{-11}$ A/μm) of a transistor (LSTP: LOW Stand-by Power) used for channel low power.

Figure 22:
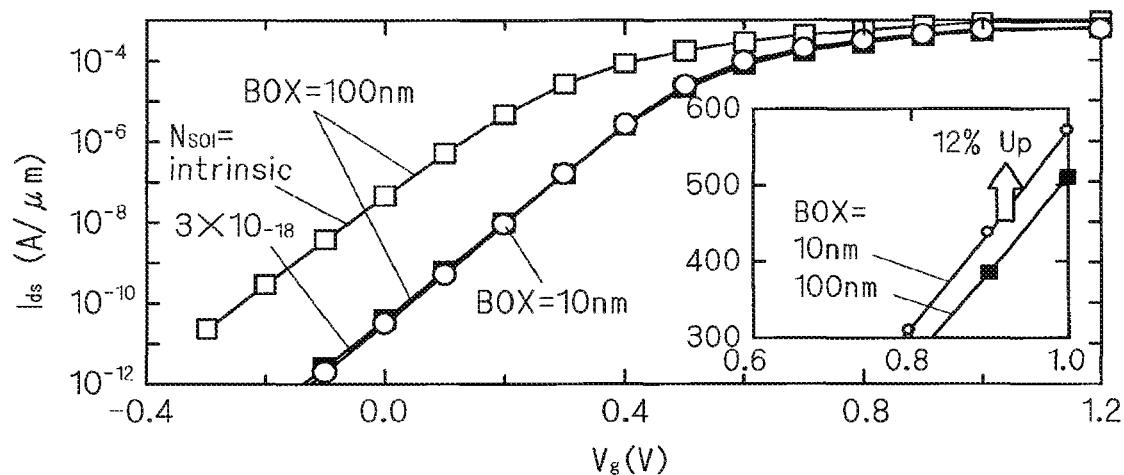

Therefore, in both of the conventional structure and the thin-film BOX structure wherein the thickness of the insulation film 4 is approximately 10 nm, the dopant concentration of the semiconductor layer 3 is set to $3 \times 10^{18}$ $cm^{-3}$. FIG. 22 shows a calculation result of the transistor drive current Ids relative to the gate voltage Vd. As shown in an enlarged view with circles in FIG. 22, it is known that the transistor drive current Ids is increased by 12% in the thin-film. BOX structure in comparison to the conventional structure.

Further, the thin-film BOX structure, wherein the double gate structure is adopted, is advantageous in its short channel characteristics. Therefore, the off-leak current for the LSTP can be realized though the dopant concentration of the semiconductor layer 3 is reduced. In the SOI structure where the conventional structure is adopted, the mobility is deteriorated by the increase of the dopant concentration of the semiconductor layer 3, and the transistor drive current is lower than in the SOI structure in which the thin-film. BOX structure is adopted (FIG. 22).

As described, the delay of the inverter is in proportion to (parasitic capacitance/transistor drive current). In the conventional structure, the contribution made by the effect from the reduction of the junction capacitance is larger than that of the effect from the deterioration of the transistor drive current. As a result, the delay of the inverter is increased in the conventional structure in comparison to a case where the thin-film BOX structure is adopted (for example, structure with dopant region).

Figure 23:
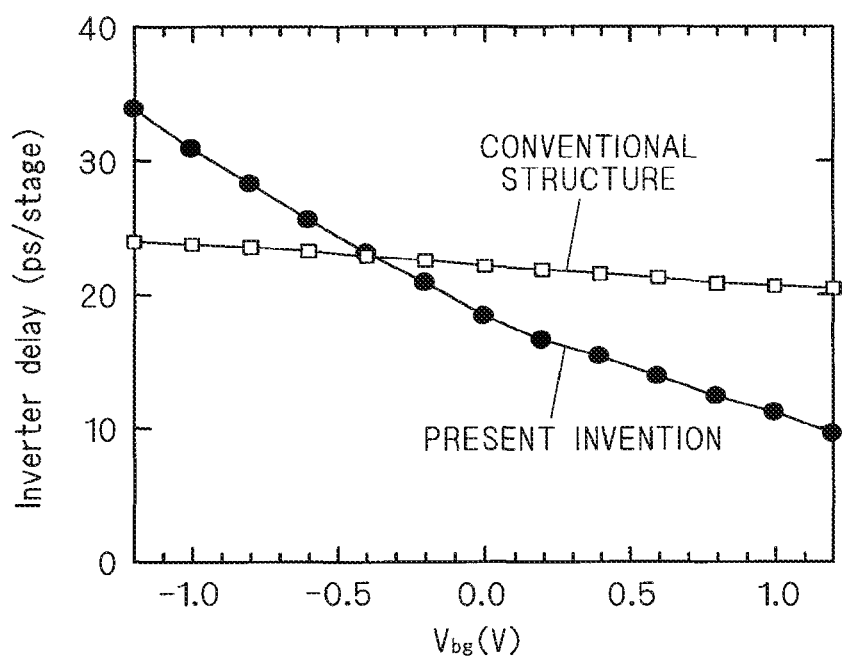

In the semiconductor devices illustrated in FIGS. 4 and 5, as described earlier, the transistor can realize a high drive performance when the back bias is applied thereto without any increase of the junction leak current, which is illustrated in FIG. 23. As illustrated in FIG. 23, the forward bias of approximately 1.2 V is applied as the back bias to the first field-effect transistor. Accordingly, the delay of the inverter can be further reduced to a half in comparison to the conventional structure.

As described so far, according to the constitutions illustrated in FIGS. 4 and 5 where the dopant regions 13 and 14 are provided, the operation speed of the first field-effect transistor can be increased. As a result, the operation speed of the logic circuit including the first field-effect transistor as its component can also be increased.

In the present embodiment, the backward bias is applied as the back bias to the second field-effect transistor. The dopant concentration of the dopant region 26 is lower than that of the dopant region 25. The dopant concentration of the dopant region 26 is the dopant concentration in vicinity of the surface of the semiconductor support substrate 1 below the gate electrode 20 constituting the second field-effect transistor. The dopant concentration of the dopant region 25 is the dopant concentration in vicinity of the surface of the semiconductor support substrate 1 below the gate electrode constituting the first field-effect transistor.

Therefore, the operation of the memory circuit including the second field-effect transistor can be more stable. The effect of the improvement in the operation stability of the memory circuit is described referring to simulation results and the like.

FIG. 24 shows a result in which a static noise margin was obtained based on the simulation in a case where the backward bias is applied as the back bias to the second field-effect transistor in the semiconductor devices illustrated in FIGS. 4 and 5. A dotted line in FIG. 24 shows a result obtained in a case where the backward bias was not applied as the back bias to the second field-effect transistor. A solid line in FIG. 24 shows a result obtained in a case where the backward bias was applied as the back bias to the second field-effect transistor. SRAM conventionally constitutes an inverter circuit. A horizontal axis in FIG. 24 indicates a gate voltage of the transistor on one side constituting the inverter, while a vertical axis in FIG. 24 indicates a gate voltage of the transistor on the other side constituting the inverter.

The larger a planar dimension of a region surrounded by curved lines shown in FIG. 24 is, the larger the margin is, which indicates the stable operation of the SRAM. As illustrated in FIG. 24, when the backward bias is applied as the back bias, the noise margin is improved by 23% in comparison to a case where the back bias is not applied.

As already illustrated in FIG. 1, the inventors found out that the threshold voltage variability could be reduced by 16% when the backward bias was applied as the back bias to the thin-film SOI transistor (film thickness of the insulation film 4 is at most 10 nm). Therefore, when the backward bias is applied as the back bias to the second field-effect transistor illustrated in FIGS. 4 and 5, the stability in the operation of the memory circuit can be dramatically improved.

Figure 25:
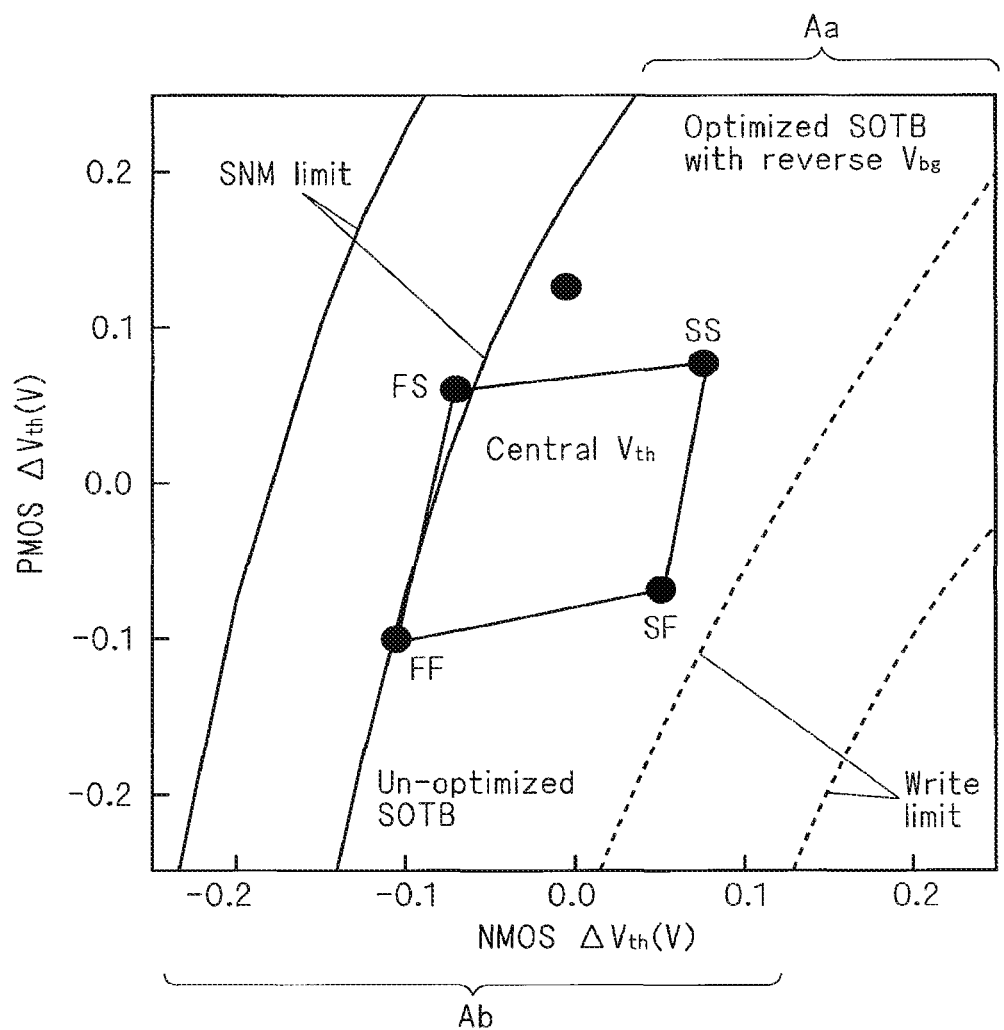

Further, referring to FIG. 25 is described a relationship between the variability of the threshold voltage Vth and the stable operation of the SRAM in the SRAM having such an inverter configuration that PMOS and NMOS are provided. A horizontal axis in FIG. 25 indicates the threshold voltage of the NMOS, while a vertical axis in FIG. 25 indicates the threshold voltage of the PMOS.

The operation margin of the SRAM is subjected to both of a SNM limit and a Write limit illustrated in FIG. 25. As a result, the scope of the operation margin is a region Aa or a region Ab illustrated in FIG. 25. The region Aa indicates a case where the backward bias is not applied as the back bias to the second field-effect transistor constituted as illustrated in FIGS. 4 and 5. The region Ab indicates a case where the backward bias is applied as the back bias to the second field-effect transistor constituted as illustrated in FIGS. 4 and 5. As far as a corner model (range surrounded by dots FS, FF, SS and SF) on which the threshold voltage variability of the transistor is reflected stays within the range surrounded by the SNM limit and the Write limit, the SRAM can be stably operated.

As is known from FIG. 25, in a case where the backward bias is not applied, the operation margin of the SRAM is almost lost, in other words, not enough margin is provided between the region Aa and the corner model. On the contrary, in a case where the backward bias is applied, there is an enough allowance in the operation margin of the SRAM. In other words, enough margin can be provided between the region Ab and the corner model.

Thus, it can also be learnt from the data illustrated in FIG. 25 that the stability in the operation of the memory circuit can be improved in a case where the backward bias is applied as the back bias to the second field-effect transistor constituted as illustrated in FIGS. 4 and 5.

Second Embodiment

A semiconductor device according to the present embodiment is configured such that the source/drain region is formed at a limited position relative to the gate electrode in the semiconductor device according to First Embodiment. The constitution other than the positional relationship between the gate electrode and the source/drain region, is the same as that of First Embodiment. Therefore, in the description below, the description of the same constitution is omitted, and only the different constitution (positional relationship between the gate electrode and the source/drain region) is described.

Figure 26:
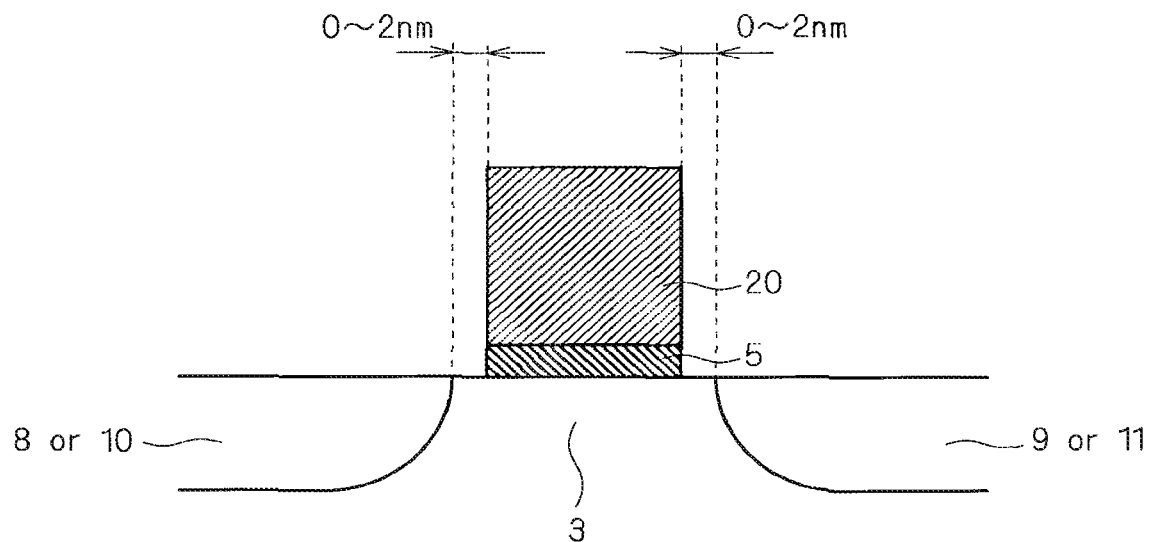
FIG. 26 is a sectional view illustrating a constitution of a semiconductor device according to Second Embodiment of the present invention.
Figure 27:
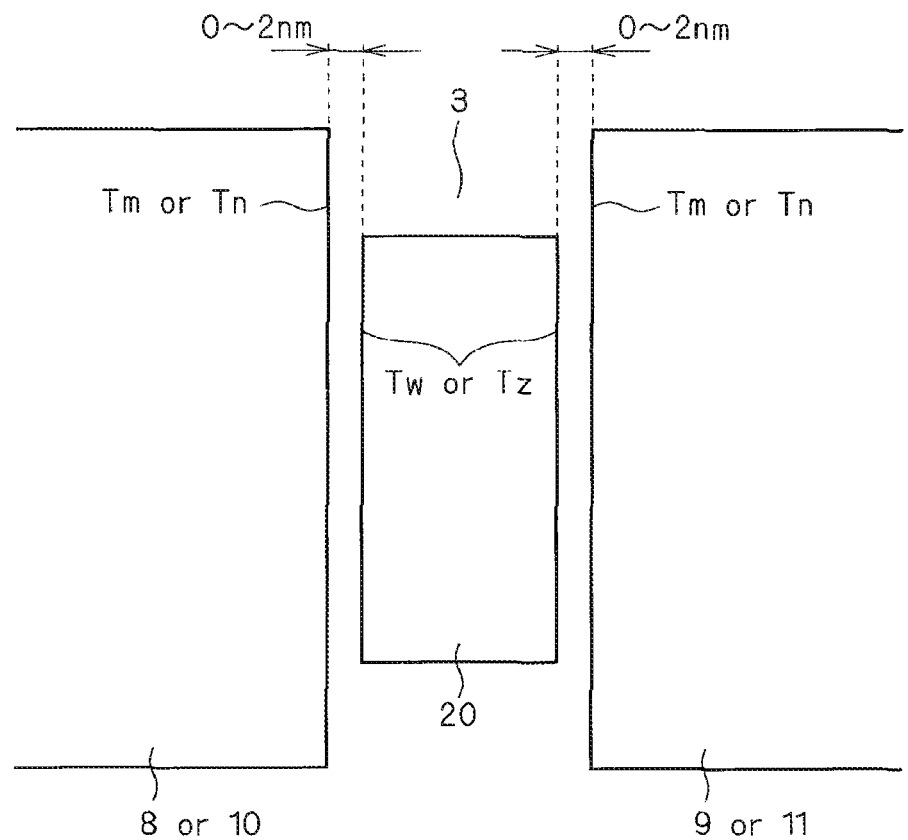
FIG. 27 is a plan view illustrating the constitution of the semiconductor device according to Second Embodiment.

FIG. 26 is a schematic sectional view illustrating a positional relationship between the first gate electrode 20 and the source/drain regions 8 and 9 constituting the first field-effect transistor described in First Embodiment. FIG. 26 is a schematic sectional view illustrating a positional relationship between a second gate electrode 20 and the source/drain regions 10 and 11 constituting the second field-effect transistor described in First Embodiment. FIG. 27 is a plan view of the constitution illustrated in FIG. 26 from upward.

As illustrated in FIG. 26, a gate structure is formed on the semiconductor layer 3. As described in First Embodiment, the gate structure is a multilayered structure where the gate insulation film 5 and the gate electrode 20 are provided in this order. Further, as shown in FIG. 26, the source/drain regions 8 and 9 (or 10 and 11) are formed in the surface of the semiconductor layer 3 on both ends of the first and second electrodes 20.

As is learnt from FIGS. 26 and 27 in plan view, end portions Tm of the source/drain regions 8 and 9 on the side where the first gate electrode 20 is formed correspond to an end portion Tw of the first gate electrode 20. Or, the end portions Tm of the source/drain/regions 8 and 9 on the side where the first gate electrode 20 is formed are provided on the side where the first gate electrode 20 is not formed to be distant from the end portion Tw by a predetermined distance.

In a similar manner, in plan view, end portions Tn of the source/drain regions 10 and 11 on the side where the second gate electrode 20 is formed correspond to an end portion Tz of the second gate electrode 20. Or, the end portions Tn of the source/drain regions 10 and 11 on the side where the second gate electrode 20 is formed are provided on the side where the first gate electrode 20 is not formed to be distant from the end portion Tz by a predetermined distance.

More specifically, a distance between the end portions Tm (or end portions Tn) of the source/drain regions 8 to 11 and the end portion Tw (or end portion Tz) of the gate electrode 20 in plan view is at least 0 and at most 2 nm as illustrated in FIGS. 26 and 27.

Figure 28:
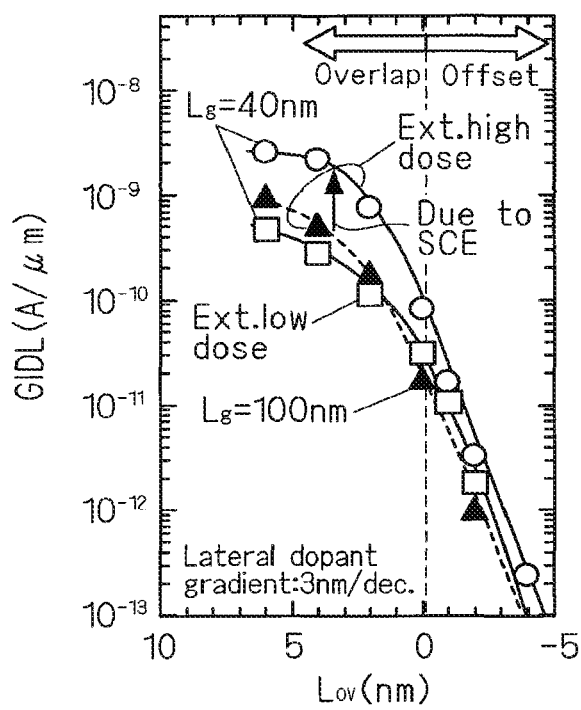
FIGS. 28 and 29 are illustrations of simulation results for describing an effect of the semiconductor device according to Second Embodiment.

When the dopant ions are implanted in order to form the source/drain regions 8 to 11 with the gate electrode 20 being used as the mask, and a heat treatment is performed for activation, a small amount of the dopant ions diffuse into below the gate electrode 20. As a result, parts of the gate electrode 20 and the source/drain regions 8 to 11 overlap with each other in plan view. The inventors confirmed that the partial overlap results in the increase of GIDL (Gate Induced drain leakage) current based on a simulation result. The inventors also confirmed that the GIDL current further increased as the overlapping region increased based on the simulation result (for example, see FIG. 28 (a horizontal axis indicates an overlapping length, and a vertical axis indicates a GIDL current).

Therefore, the gate electrode 20 and the source/drain regions 8 to 11 desirably do not overlap with each other in plan view in order to reduce the GIDL current. In other words, the distance between the end portions Tm (or end portions Tn) of the source/drain regions 8 to 11 and the end portion Tw (or end portion Tz) of the gate electrode 20 in plan view is desirably at least 0.

When the gate electrode 20 and the source/drain regions 8 to 11 overlap with each other in plan view, the parasitic capacitance is generated therebetween. When the parasitic capacitance is increased, the operation of the transistor is more delayed. Therefore, the gate electrode 20 and the source/drain regions 8 to 11 desirably do not overlap with each other in plan view in order to reduce the parasitic capacitance as well.

However, the drain current is more lessened as the source/drain regions 8 to 11 are more distant from the gate electrode 20, as a result of which the operation of the transistor is slowed down (longer operation delay time). Therefore, it is not preferable that the source/drain regions 8 to 11 be too distant from the gate electrode 20 in view of the operation delay.

Figure 29:
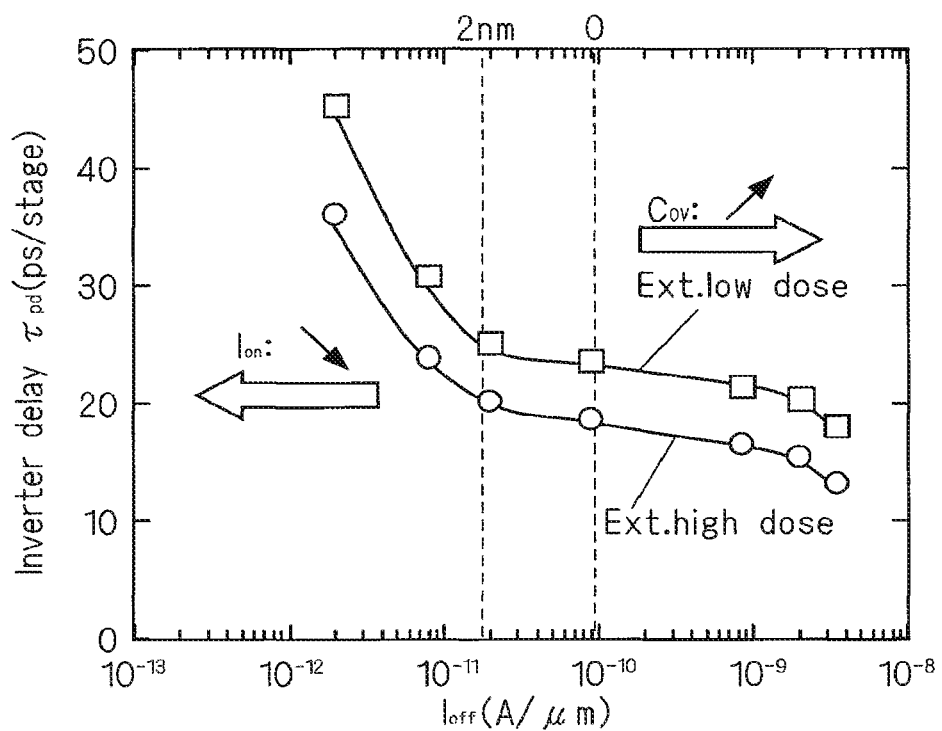

The inventors conducted the simulation, and a result shown in FIG. 29 was thereby obtained. In order to control the operation delay and GIDL current at the same time, the distance between the end portions Tm (or end portions Tn) of the source/drain regions 8 to 11 and the end portion Tw (or end portion Tz) of the gate electrode 20 in plan view is necessarily at least 0 and at most 2 m. FIG. 29 shows a simulation result in a case where the concentration of the dopant region is high and, low in the source/drain regions 8 to 11. As illustrated in FIG. 29, when the distance in plan view is larger than 2 nm, the operation delay of the transistor is drastically increased.

As described so far, in the semiconductor device according to the present embodiment, the distance between the end portions Tm (or end portions Tn) of the source/drain regions 8 to 11 and the end portion Tw (or end portion Tz) of the gate electrode 20 in plan view is desirably at least 0 and at most 2 nm as illustrated in FIGS. 26 and 27.

Accordingly, the GIDL current can be reduced while the high-speed operation of the transistor is maintained. The semiconductor device according to the present embodiment is based on the semiconductor device according to First Embodiment. Therefore, the effects described in First Embodiment can be naturally exerted by the semiconductor device according to the present embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor support substrate of a first conductivity type, wherein the semiconductor support substrate comprises:
      a first region on which a first field-effect transistor is formed; and
      a second region on which a second field-effect transistor is formed, the second region being different from the first region; and
   a first element separation film formed in the semiconductor support substrate such that the first element separation film is formed between the first region and the second region,
   wherein the first region comprises:
      a first insulation layer formed on the semiconductor support substrate such that the first insulation layer is disposed above the semiconductor support substrate in cross-sectional view;
      a first semiconductor layer formed on the first insulation layer such that the first semiconductor layer is disposed above the first insulation layer in cross-sectional view;
      a second element separation film formed in the semiconductor support substrate, the second element separation film separate from the first element separation film in cross-sectional view;
      a first gate electrode formed on the first semiconductor layer via a first gate insulating film, the first gate insulating film being separate from the first insulation layer in cross-sectional view;
      first source and drain regions of a second conductivity type formed in the first semiconductor layer, the second conductivity type being opposite to the first conductivity type;
      a first impurity region of the second conductivity type formed in the semiconductor support substrate;
      a second impurity region of the first conductivity type formed in the first impurity region, the second impurity region electrically separated from the semiconductor support substrate by the first impurity region; and
      a third impurity region of the first conductivity type formed in the second impurity region, the third impurity region being located under the first gate electrode, the third impurity region being in contact with the first insulation layer, a dopant concentration of the third impurity region being higher than a dopant concentration of a channel region of the first semiconductor layer located between the first source and drain regions.

2. The semiconductor device according to the claim 1, wherein a first feeder region for applying a back bias to the second impurity region is formed over the semiconductor support substrate adjacent to the first field-effect transistor,
wherein the third impurity region is located in a region which is shallower than a bottom of the second element separation film of the first region,
wherein the second impurity region is formed so as to surround the bottom of the second element separation film of the first region, and
wherein the second impurity region is a part of the first feeder region.

3. The semiconductor device according to the claim 1, wherein the first field-effect transistor is a fully depleted structure.

4. The semiconductor device according to the claim 3, wherein a thickness of the first insulation layer is 10 nm.

5. The semiconductor device according to the claim 3, wherein the dopant concentration of the third impurity region is a dopant concentration of a first conductivity type dopant in the third impurity region, and
wherein the dopant concentration of the region of the first semiconductor layer is a first conductivity type dopant in the channel region of the first semiconductor layer.

6. The semiconductor device according to the claim 1, wherein seventh impurity regions of the second conductivity type are located under the first source and drain regions, and
wherein the seventh impurity regions are formed between the first insulation layer and the second impurity region.

7. The semiconductor device according to the claim 1, wherein the first conductivity type is p-type, and
wherein the second conductivity type is n-type.

8. The semiconductor device according to the claim 1, wherein the second region comprises:
a second insulation layer formed on the semiconductor support substrate such that the second insulation layer is disposed above the semiconductor support substrate in cross-sectional view;
a second semiconductor layer formed on the second insulation layer such that the second semiconductor layer is disposed above the second insulation layer in cross-sectional view;
a third element separation film formed in the semiconductor support substrate, the third element separation film separate from the first element separation film and the second element separation film in cross-sectional view;
a second gate electrode formed on the second semiconductor layer via a second gate insulating film, the second gate insulating film being separate from the first insulation layer or the second insulation layer in cross-sectional view;
second source and drain regions of the second conductivity type formed in the second semiconductor layer;
a fourth impurity region of the second conductivity type formed in the semiconductor support substrate;
a fifth impurity region of the first conductivity type formed in the fourth impurity region, the fifth impurity region being electrically separated from the semiconductor support substrate by the fourth impurity region; and
a sixth impurity region of the first conductivity type is formed in the fifth impurity region, the sixth impurity region being located under the second gate electrode, the sixth impurity region being in contact with the second insulation layer.

9. The semiconductor device according to the claim 8, wherein a dopant concentration of the sixth impurity region is lower than the dopant concentration of the third impurity region,
wherein a forward bias is applied to the second impurity region when the first field-effect transistor is operated, and
wherein a backward bias is applied to the fifth impurity region when the second field-effect transistor is operated.

10. The semiconductor device according to the claim 8, wherein the first field-effect transistor constitutes a logic circuit, and
wherein the second field-effect transistor constitutes a memory circuit.

11. The semiconductor device according to the claim 8, wherein the sixth impurity region is located in a region which is shallower than a bottom of the third element separation film of the second region, and
wherein the fifth impurity region is formed so as to surround the bottom of the third element separation film of the second region and is a part of a second feeder region for applying a back bias to the fifth impurity region, which is formed over the semiconductor support substrate adjacent to the second field-effect transistor.

12. The semiconductor device according to the claim 11, wherein the second field-effect transistor is a fully depleted structure.

* * * * *